(12) United States Patent
Fernandez-Ceballos et al.

(10) Patent No.: US 7,569,470 B2
(45) Date of Patent: Aug. 4, 2009

(54) METHOD OF FORMING CONDUCTING NANOWIRES

(75) Inventors: Sergio Fernandez-Ceballos, Reinosa (ES); Giuseppe Manai, Dublin (IE); Igor Vasilievich Shvets, Castleknock (IE)

(73) Assignee: The Provost Fellows And Scholars Of The College Of The Holy And Undivided Trinity Of Queen Elizabeth Near Dublin, Dublin (IE)

( * ) Notice: Subject to any disclaimer, the term of this patent is extended or adjusted under 35 U.S.C. 154(b) by 70 days.

(21) Appl. No.: 11/915,518

(22) PCT Filed: May 26, 2006

(86) PCT No.: PCT/EP2006/062642

§ 371 (c)(1),
(2), (4) Date: Nov. 26, 2007

(87) PCT Pub. No.: WO2006/125825

PCT Pub. Date: Nov. 30, 2006

(65) Prior Publication Data

US 2008/0206936 A1      Aug. 28, 2008

(30) Foreign Application Priority Data

May 27, 2005     (IE)     ................................ S2005/0351

(51) Int. Cl.
*H01L 21/44*     (2006.01)
(52) U.S. Cl. ........................ 438/597; 438/602; 438/603; 438/604

(58) Field of Classification Search ................. 438/151, 438/602–607; 977/720, 721, 723
See application file for complete search history.

(56) References Cited

U.S. PATENT DOCUMENTS

| 4,124,934 A | 11/1978 | De Brebisson |
| 5,882,952 A | 3/1999 | Kizuki et al. |
| 6,251,755 B1 | 6/2001 | Furukawa et al. |
| 6,303,516 B1 * | 10/2001 | Morita et al. ................ 438/758 |
| 6,667,492 B1 | 12/2003 | Kendall |
| 6,696,372 B2 * | 2/2004 | Wang et al. .................... 438/47 |
| 7,220,346 B2 * | 5/2007 | Penner et al. ................. 205/76 |
| 7,459,222 B2 * | 12/2008 | Shvets et al. ................ 428/826 |

FOREIGN PATENT DOCUMENTS

| WO | WO 01/18866 | 3/2001 |
| WO | WO 2004/003535 | 1/2004 |

OTHER PUBLICATIONS

Roos et al., "High temperature self-assembly of Ag nanowires on vicinal Si(001)." Journal of Physics: Condensed Matter, vol. 17, Nr. 16, pp. S1407-S1414, 2005.
Finnie et al., "Epitaxy: the motion picture." Surface Science, vol. 500, Nr. 1-3, pp. 437-457, Dec. 2000.

* cited by examiner

*Primary Examiner*—Kevin M Picardat
(74) *Attorney, Agent, or Firm*—Scott E. Kamholz; Foley Hoag LLP

(57) ABSTRACT

A method of preparing an array of conducting or semi-conducting nanowires may include forming a vicinal surface of stepped atomic terraces on a substrate, and depositing a fractional layer of dopant material to form nanostripes having a width less than the width of the atomic terraces. Diffusion of the atoms of the dopant nanostripes into the substrate may form the nanowires.

54 Claims, 19 Drawing Sheets

METHOD OF FORMING CONDUCTING NANOWIRES

INTRODUCTION

The present invention relates to a nanowire assembly and in particular to a method for preparing such a nanowire assembly. It further relates to various electronic devices, including field effect transistors, comprising the nanowire assembly.

During the recent years there has been a massive increase in research effort on nanoscale conducting objects. Most commonly the attention in this area is paid to nanowires. In this specification, the term "conducting nanowire" or more simply "nanowire" is defined generally as an elongated object in which both of its orthogonal cross-sectional dimensions are in the nanoscale range: e.g. 0.2-20 nm and that is capable of transferring charge along its length. Both terms "nanowires" and "conducting nanowires" are used interchangeably in this specification. It is important to stress that both of the cross sectional dimensions must be in this range, not only one of them. Those skilled in the art will readily appreciate that if the definition were broader and suggested that only one of the two cross-sectional dimensions must be in the nanoscale range then any thin film would fit the definition of nanowire as its thickness, i.e. one of the two cross-sectional dimensions is in this range. In practice continuous thin films with a thickness in the nanometre and even sub-nanometre range are well known and are not the subject of the present specification. It is important to stress that the nanowires must be capable of transferring change along their length. This means that such nanowires should be placed on substrates with relatively high resistance, i.e. the resistance of the substrate should be at least not much smaller than the resistance of the nanowire itself or alternatively the substrate must be separated from the nanowire by a layer of insulating material. If this condition is not fulfilled, then most of the current is drained from the nanowire into the substrate. The second common condition is that in order to transfer current along the nanowire, it should be possible to connect input and output contacts to it. In practice this means that the nanowire or an array of nanowires should be positioned on a flat substrate, as making contacts to an unsupported nanowire is difficult.

The importance of conducting nanowires increases with the continuing miniaturization of electronic devices which reduces the size of the drain and source of the transistor to the range of below 100 nm and also by the expectation that the electronic and optical properties of the material can be altered when its dimensions are reduced to the nanometre range. For example, silicon does not have visible luminescence as this is an indirect band gap material, but in contrast silicon nanowires are expected to have visible photoluminescence (J. D. Holmes, et al, Science, 287 (2000) 1471), which could open up the prospect of using these for making lasers. Some materials that are conducting in the bulk may become semi-conducting in the nanowire format.

There are many approaches to fabrication of nanowires, some of which are described below.

H. Hamatsu et al (Jpn. J. Appl. Phys. Vol 35 (1996) L1148-1150) described a method for forming silicon nanowires based on anisotropic etching of Si layer deposited on top of p-type (110) SIMOX substrate. Another lithographic process for fabricating the nanowires of Si with the dimension down to 50 nm is described by M. Macucci et al (Microelectronic Engineering 61-62 (2002) 701-705). It is based on anisotropic etching and steam thermal oxidation. Another method utilizing pyrolysis of silane within hexagonal close packed nanochannel alumina templates is described by Xin-Yi Zhang et al (Advanced Materials, 13 (2001) 1238-1241). This method produces a brush-like array of nanowires growing perpendicular to the substrate surface. Yet, another method for forming silicon nanowires by chemical vapour deposition on alumina membrane is described by M. Lu et al (Chem. Phys. Lett. 374 (2003) 542). Wen-Sheng Shi et al (Adv. Mater 12 (2000) 1343-1345) described another method of forming silicon nanowires by evaporation of silicon monoxide on flat silicon substrates. The nanowires obtained in this way are relatively long, up to 2 mm in length. Another method of forming silicon nanowires is described by Junjie Niu et al (Chem. Phys. Lett 367 (2003) 528). In this latter method they used chemical vapour deposition of Si from silane in the presence of argon and hydrogen on anodically oxidized aluminium that forms a nanochannel template.

F. J. Himpsel et al describe another method of forming nanowires on silicon surfaces (Solid State Comm. 117 (2001) 149-157). Their method utilizes a vicinal substrate of Si(111). They deposit $CaF_2$ on the surface that decorates the step edges of the substrate. They demonstrated that thin layer of Au can then be formed on such a substrate in which the stripes of $CaF_2$ are used as template leading to the formation on nanodots and nanowires of Au.

Another family of methods for fabrication of nanowires is based on deposition at a glancing angle. E. Olson et. al. (Appl. Phys. Lett. 65 (1994) 2740-2742) described method in which a pattern of groves is formed on a substrate by lithography. Then flux of evaporated material is deposited on the substrate not along the direction normal to it but rather at an angle. In this case some of the areas at the bottom of the groves are shadowed from the flux by the walls of the groves thus forming the wires of the evaporated material separated by the areas free from it.

It should be pointed that deposition of films at glancing angle with respect to the substrate surface is relatively well known: there are many publications on the topic. For information on this technique, reference is made to H. Alouach and C. G. Mankey, J. Mater. Res. 19 (2004) 3620. It has been demonstrated that this technique can be used to form the pillars of the material growing out of the plane of the substrate. Most of the publications on glancing angle deposition deal with relatively thick films and focus on the development of the out-of-plane film structure on the scale of tens and hundreds of nanometers or greater.

The method of forming nanowires described by T. Mueller et. al. (Nucl. Instr. And Methods in Physics Research B 175-177 (2001) 468-473) can be also considered as a member of family of glancing-deposition-based methods. In this method an array of V-grooves is formed on Si(001) surface by anisotropic etching and subsequent oxidation of the surface. Then the surface is subjected to the flux of Ge atoms. The highest concentration of Ge atoms is formed at the bottom of the groves because the bottom of the groves acts as a small area located perpendicular to the flux whereas the walls of the groves are positioned at an angle with respect to the flux. In this way Ge wires with the diameter down to 30-40 nm can be formed. Similar effect was achieved in the case of GaAs/AlGaAs grown by organometallic chemical vapor deposition on v-grooved substrates as reported by E. Kapon et al (Appl. Phys. Lett 60 (1992) 477-479). In this approach the nanowires are formed at the bottom of the groves due to the difference in the speed of the chemical deposition reactions at the crests and troughs of the grooves. R. M. Penner describes method of forming nanowires by electrodeposition (J. Phys. Chem. B 106 (2002) 3339-3353). In this method nanowires grow along the step edges as electrodeposition reaction occurs faster at the step edges compared to the flat areas of the substrate.

It is an object of the present invention to provide a technique for creating nanowires that would be substantially universal, i.e. applicable to a variety of substrates and nanowire materials, as opposed to being limited to a particular material and particular chemical reaction. There is further need to form arrays of regular nanowires with well-defined preferential orientation as opposed to bundles of nanowires having no well-defined preferential orientation. There is further need to form nanowires on relatively insulating substrates, so that the resistance of the substrate is preferably greater and definitely not much smaller than the resistance of the nanowires themselves. There is further need to form nanowires on substrates in such a fashion that electrical contacts can be connected to them.

The second object of the present invention is to provide a method for forming nanowires that results in nanowires positioned on a substrate in planar fashion in contrast to unsupported nanowires.

Yet another object is to provide the nanowires that are positioned on a substrate so that they have preferential orientation along the substrate surface.

Another object is to provide the method for forming arrays of nanowires in which the mean separation between the individual nanowires can be controlled as well as the cross-sectional size of the individual nanowires.

A further object of the invention is to provide an array in which the nanowires are significantly of the same cross-sectional dimensions, in both width and breadth.

Yet another object of the invention is to provide nanowires of p-type and n-type doped semiconductor materials which are suitable for making a nanowire based field effect transistor.

STATEMENTS OF INVENTION

According to a first aspect of the invention, there is provided a method of preparing an array of conducting or semi-conducting nanowires comprising the steps of:
(a) forming a vicinal surface (1) of stepped atomic terraces (2) on a substrate (100);
(b) depositing a fractional layer of dopant material to form nanostripes (10) having a width less than the width of the atomic terraces;
wherein diffusion of the atoms of the dopant nanostripes into the substrate forms the nanowires.

According to one embodiment of the invention, the dopant material of step (b) is either one or more of As, Sb, In, Ga, Al, B and P, or is a doped semiconductor material chosen from Si, Ge or Si—Ge alloy doped with one or more of As, Sb, In, Ga, Al, B or P. Hence "dopant material" for this embodiment will also encompass a doped semiconductor material. Furthermore, an annealing step may take place after step (b).

According to a preferred embodiment of the first aspect of this invention, there is provided a method of preparing an array of conducting or semi-conducting nanowires comprising:
(a) forming a vicinal surface of stepped atomic terraces on a substrate;
(b) depositing a fractional layer of dopant material to form nanostripes having a width less than the width of the atomic terraces;
(c) covering the nanostripes with an over layer to form a multilayer structure;
(d) optionally annealing the multilayer structure to cause diffusion of atoms of the dopant nanostripes into one or both of the substrate and over layer to form nanowires.

As before, an additional annealing step may be carried out prior to depositing the over layer in step (c). Furthermore, it will be understood that step (c) involves covering the majority of the atomic terraces including the nanostripes with an over layer. Hence, the atomic terrace surfaces without the nanostripe will also be covered by the over layer.

In one specific embodiment of this aspect of the invention, the final annealing step of the multilayer structure is essential and the method comprises steps (a), (b), (c) and (d). Annealing generally allows epitaxial material formation in the nanowire.

In accordance with this aspect of the invention, the dopant nanostripes are generally formed as a follows: the flux of the atoms forming the fractional layer of the dopant material is collimated and the dopant nanostripes are formed by shallow angle deposition of the collimated flux.

Preferably, shallow angle deposition occurs at an angle substantially the same as the miscut angle of the substrate from a low index surface. It will be understood that according to the invention the phrase "substantially the same" will define a range of values. For example, this phrase could mean that shallow angle deposition occurs at an angle from 0.05 to 15 times the miscut angle of the substrate.

According to one embodiment of the invention, the flux of the atoms forming the fractional layer of dopant material is directed substantially along the miscut azimuth direction along the descending step direction. Alternatively, the flux of the atoms forming the fractional layer of dopant material is directed substantially along the miscut azimuth direction along the ascending step direction. Again, it will be understood that according to the invention the phrase "substantially along" or "broadly along" will define a range of values. It will be understood that the flux does not have to be exactly aligned along the azimuth of the miscut direction. The flux could deviate from the exact miscut azmith and still provide atomic terrace shadowing within the scope of the invention. For example, the flux could be directed along 20 to 30 degrees off the azimuth. The ultimate aim of this step is that the flux is directed at an angle which still provides atomic shadowing. Such a shallow angle could be more or less perpendicular to the atomic steps yet still provide atomic shadowing.

Ideally, the method of the invention results in atomic terraces of the substrate which are partially shadowed by the atomic steps to result in non-uniform coverage of the dopant material at different areas of the atomic terraces. This is what we generally term "atomic terrace shadowing". This essentially means that in some areas the atomic terraces will be exposed to the flux of the atoms forming the fractional layer of dopant material and the dopant material will be deposited on these exposed areas to form the nanostripes. However, other areas which are subject to "atomic terrace shadowing" in that they are partially shadowed by the atomic steps will not be exposed to the flux. It will be understood that the greater the miscut angle of the substrate, the more difficult it is to achieve this atomic terrace shadowing. By way of a non-limiting example, it will be understood that if the miscut angle of the substrate is 2 degrees and the flux is deposited at 4 degrees along the descending step direction, the resultant nanostripes/nanowires will be half the width of the terraces.

According to a preferred embodiment of this aspect of the invention, the width of the dopant nanowires is determined by controlling the angle of the collimated flux of atoms forming the fractional layer of dopant material with respect to the atomic terraces of the substrate.

It is a considerable advantage of the present invention that the nanowires are now formed positioned on the substrate in contrast to being unsupported and additionally the nanowires are advantageously present on the substrate in a planar fashion. It is also possible in accordance with the invention to provide the nanowires so that they are positioned on the substrate in a preferential orientation along a given direction of the substrate surface. This is yet another significant advantage of the invention.

It will be understood that the method of the invention enables the formation of an array of conducting or semiconducting nanowires wherein the separation between the nanowires and the cross-sectional dimensions of the nanowires can be controlled. Preferably, the separation between the nanowires is in the range from approximately 0.2 nm to approximately 50 nm. Ideally, the cross-sectional dimensions of the nanowires is in the range of from approximately 1 nm to approximately 50 nm.

According to yet another aspect of the invention, a doped semiconductor material may be deposited to form the dopant nanowires. Preferably, a thin film of doped semiconductor is formed on the vicinal surface of the substrate. If a doped semiconductor material is used in this manner, it will be understood that there may be no need for the deposition of an over layer and a subsequent annealing step. The nanowires will form directly after deposition of the doped semiconductor.

According to another embodiment of this aspect of the invention, a layer (fractional or otherwise) of dopant material is deposited to form nanostripes. Preferably, the layer of dopant material is deposited at a non-glancing angle to result in the entire surface or part of the surface of the substrate being covered by the dopant. The surface is then exposed to energized ion beam etching of the dopant material at a shallow angle with respect to the surface to remove the dopant material from some parts of the atomic terraces to form the nanostripes. Preferably, the energized ion beam is collimated and directed at an angle that is substantially the same as the miscut angle of the substrate. The energized ion beam may be Argon ions accelerated to the energy of 20 KeV or 200 KeV.

An alternative embodiment of this aspect of the invention involves the deposition of a layer (fractional or otherwise) of dopant material to form the nanostripes. Preferably, the layer of dopant material is deposited at a non-glancing angle to result in the entire surface or most of the surface of the substrate being covered by the dopant. The surface is exposed to a collimated beam of chemically reactive species which reacts with the substrate and etches the dopant material away to form the nanostripes. Preferably, the beam is collimated and directed at a shallow angle with respect to the surface. Preferably, the angle is substantially the same as the miscut angle of the substrate. Preferably, the chemically reactive species is a chemically reactive plasma that reacts with Si for example and turns it into $SiH_4$ or another gas that is easily removed.

According to these alternative embodiments of the invention, some areas of the atomic terrace are not exposed to the beam or are exposed to it to a much smaller extent than other areas. These areas form the nanostripes. The width of the nanowires is controlled by the ability to control the angle of the beam with respect to the atomic terraces of the substrate.

According to yet another embodiment of this aspect of the invention, a fractional layer of dopant material is deposited on the vicinal surface of the substrate to form nanostripes having a width less than the width of the atomic terraces. The dopant nanowires are formed by shallow angle deposition of the collimated flux of atoms forming the fractional layer of dopant material. The shallow angle may be at an angle substantially the same or comparable to the miscut angle of the substrate ($\beta1$). The nanostripes may then be subjected to energized ion beam etching or a collimated beam of chemically reactive species of the substrate at a shallow angle ($\beta32$), wherein $\beta1$ and $\beta2$ differ, to result in the formation of nanostripes having a width less than the width of the atomic terraces.

According to yet another embodiment of the invention, a collimated flux of doped semiconductor material is deposited on the vicinal substrate at a shallow angle, so that some areas of the atomic terraces are shielded from the flux of the doped semiconductor and other areas are exposed to the flux of the doped semiconductor, to form an array of nanowires correlated with the atomic steps of the vicinal substrate. Shallow angle deposition may occur at an angle substantially the same as the angle of miscut of the surface from low index direction. Preferably, the collimated flux is directed substantially along the miscut azimuth direction along the ascending step direction. Alternatively, the collimated flux is directed substantially along the miscut azimuth direction along the descending step direction.

It will be understood that if the dopant nanostripes are of doped semiconductor material to from doped nanowires directly on the surface, there may be no need for the deposition of an over layer or the subsequent annealing step.

In accordance with still another embodiment of the invention, pairs of conversely doped dopant nanostripes may be formed on a given single atomic terrace. "Conversely doped dopant nanostripes" according to the invention will be understood to mean a pair of nanostripes comprising nanostripes of p-type and n-type dopant materials.

The method for forming these pairs of conversely doped nanostripes generally comprises the method as described previously wherein step (b) comprises the steps of
(i) collimating a first flux of atoms forming the fractional layer of the first dopant material and directing the first flux at a shallow angle with respect to the atomic terraces to form dopant nanostripes of the first material at the inner edges of the atomic steps; and
(ii) collimating a second flux of atoms forming the fractional layer of the second dopant material and directing the second flux at a shallow angle with respect to the atomic terraces to form dopant nanostripes of the second material at the outer edges of the atomic steps.

According to this embodiment, for example, a p-type nanostripe may be formed at the inner step edges of the atomic steps and an n-type nanostripe may be formed at the outer step edges of the atomic steps. The first and second dopant materials may be the same materials or different materials. An over layer may then be deposited over the nanostripes of the dopant material and the multilayer structure may be optionally annealed to allow diffusion of the dopant materials into the over layer.

Preferably, the shallow angle of (i) and (ii) have different azimuth directions.

In one embodiment of this aspect of the invention, the first flux of the first dopant material is deposited along the rising direction of the atomic steps and the second flux of atoms forming the fractional layer of the second dopant material is deposited along the descending direction of the atomic steps.

Ideally, the shallow angle is an angle that is substantially the same as the miscut angle of the substrate.

The first and second dopant materials may be the same or different materials. Furthermore, the first and second dopant materials have different concentrations of atoms to provide different concentrations of dopant atoms at the inner and the outer steps of the atomic terraces. For example, the nanostripes at the inner edge of the atomic steps could contain a significantly greater amount of the dopant material than the nanostripes at the outer edge of the atomic steps.

According to one embodiment of this invention, the first and second dopant materials are doped semiconductor materials. In this embodiment, there may be no need for the over layer and subsequent annealing step.

According to the first aspect of the invention, the vicinal substrate may be a semiconductor or an insulating material. The vicinal substrate may be selected from one of the following Si, Ge, Silicon-germanium alloy, Silicon on Insulator (SOI), MgO, $SrTiO_3$, $MgAl_2O_4$ or $Al_2O_3$.

Optionally, the vicinal substrate may be formed by heat treatment of the miscut substrate which has been subjected to lithography. For example, an array of the trenches formed by lithography on a substrate may achieve better alignment of the atomic step edges in line with the edges of the trenches.

According to another embodiment of the invention, the miscut substrate may be annealed in an electric field applied along a miscut direction substantially along the substrate surface in order to facilitate the formation of atomic terraces.

Ideally, the dopant material is selected from one or more of the following As, Sb, In, Ga, Al, B or P. Preferably, the dopant material is one of As, Sb, In, Ga, Al, B or P Preferably, the nanostripes are located at the inner steps or the outer steps of the atomic terraces. More preferably, the dopant nanostripes are from approximately 0.01 to approximately 0.9 fraction of the width of the atomic terraces on which they are positioned.

According to one embodiment of the invention, the overlayer is an insulation material or a semiconductor material. Ideally, the over-layer is a layer of SiGe alloy. Preferably, the over-layer and substrate have different diffusion coefficients whereby diffusion of the material from dopant nanostripe is mainly or totally into either the substrate or over-layer whichever has the greater diffusion coefficient for diffusion of the dopant material.

According to a preferred embodiment of the vicinal substrate and over layer are different materials. There is also envisaged the provision of an over layer and substrate having different diffusion coefficients whereby diffusion is mainly or totally into one of the materials having a greater diffusion coefficient.

In yet another embodiment of the invention, spacer nanostripes are provided prior to applying the fractional layer of dopant material to form the nanostripes. This results in the application of the fractional layer of dopant material occurring on the exposed surfaces not covered by the spacer nanostripes. Preferably, the spacer nanostripes comprise a fractional layer of spacer material of low surface energy. "Spacer nanostripes" according to the invention will be understood to mean a fractional layer of spacer material of low surface energy which may be deposited on the atomic terraces prior to depositing dopant material on the substrate.

The annealing time and temperature determine the extent of the diffusion of the dopant material from the nanostripes and therefore the diameter of the nanowires. Ideally, the annealing is for a relatively short period and in some embodiments of the invention, annealing will not be required.

It will be appreciated that according to the first aspect of the invention in general, subsequent treatment may be required to expose the nanowires. In accordance with the invention the nanowires can be exposed by means of the etching the over layer using an etching process that is sensitive to the concentration of the dopant impurities. This means that the etching process removes the undoped areas of the over layer faster leaving exposed the areas into which the dopant material has arrived by diffusion. This is also termed preferential etching.

It will be understood that if the dopant material of the invention is a doped semiconductor than etching may not be required as the over layer may not be present.

According to a more specific aspect of this invention, another embodiment of the method comprises the following:

forming a vicinal surface of stepped atomic terraces on a substrate;

depositing doped semiconductor material to form nanowires having a width less than the width of the atomic terraces whereby the flux of the doped semiconductor material is collimated and directed at an angle that is comparable with the miscut angle of the substrate whereby the atomic terraces of the surface are partially shadowed by the atomic steps leading to the nonuniform coverage of the doped semiconductor material at different areas of the atomic terraces;

optionally annealing the nanowires after the deposition.

In this way the nanowires may be deposited in one step from the doped semiconductor material, without the need for the deposition of an over layer.

According to a second aspect of the invention, there is provided a number of electronic devices comprising the nanowires made in accordance with the invention.

Preferably, the electronic device is a field effect transistor device, comprising a gate, drain and source and a channel between the drain and the source, wherein the channel between the drain and source consists of one or more nanowires made in accordance with the method of the invention. Preferably, the gate may be separated from the nanowire channel by a dielectric layer. Ideally, the dielectric layer is a layer of oxide or nitride.

In accordance with one embodiment of this aspect of the invention, the nanowires of the invention which are made using p-type and n-type doped semiconductors may be used. In this embodiment, the gate is a semiconductor material doped conversely to the doping of the channel. That means that, for example, if the channel is composed of the nanowires that are p-type doped then the gate should be formed of a semiconductor that is n-type doped and vice-versa. In this embodiment of the invention the dielectric layer separating the gate from the channel may not be required. According to a further embodiment of this aspect of the invention one or more nanowires may be formed on a substrate of the type silicon on insulator (SOI) wherein a further layer of heavily doped silicon is ideally located below the insulator to serve as the gate electrode.

According to another embodiment of this aspect of the invention, there is provided a method of making a field effect transistor device, based on the nanowires of the invention, wherein the transistor has a dielectric layer separating the gate from the channel comprising the steps of forming the dielectric layer, preferably a dielectric layer of oxide or nitride, directly on the nanowires which form the channel and subsequently forming the gate over this dielectric layer.

According to this aspect of the invention, there is also provided a junction field-effect transistor device with a gate and a channel comprising one or more nanowires made in accordance with the method of the invention wherein the gate is doped with a dopant converse to the dopant of the channel. Preferably, the dopant of the gate is a p-type or n-type and the dopant of the channel is a p-type or n-type wherein the dopant of the gate and channel differ. For example, a p-type dopant may be present in the gate and an n-type dopant may be present in the channel or vice versa. Ideally, there is no dielectric layer separating the gate from the channel.

According to a third aspect of the invention, there is provided a method for making a complementary pair of transistors, namely a p-type and n-type transistor using the pairs of conversely doped nanostripes formed in accordance with the first aspect of the invention. According to aspect of the invention, step (b) of the general method of the invention comprises the steps of a) collimiating a first flux of atoms forming the fractional layer of dopant material and directing the first flux at a shallow angle with respect to the atomic terraces to form dopant nanostripes of the first material at the inner edge of the atomic steps; and b) directing a second collimated flux of atoms forming the fractional layer of dopant material at a shallow angle with respect to the atomic terraces to form dopant nanostripes of the second material at the outer edge of the atomic steps.

Preferably, the shallow angle of (a) and (b) have different azimuth directions. More preferably, the first flux of the first dopant material is deposited along the rising direction of the atomic steps and the second flux of atoms forming the fractional layer of the second dopant material is deposited along the descending direction of the atomic steps. Even more preferably, the shallow angle is an angle that is substantially the same as the miscut angle of the substrate.

Ideally, the first and second dopant materials are the same or different materials. Alternatively, the nanostripes formed at the inner and outer step edges have different amounts of dopant materials.

The transistor may be formed out of the complementary pair of transistors as defined above by forming a dielectric layer over the nanowires and subsequently forming the gates of the transistor on top of the dielectric layer.

According to one embodiment of this aspect of the invention, during the formation of the nanowires an over layer is deposited to form a multilayer structure and the multilayer structure is subjected to an optional annealing step to result in the diffusion of the dopant material into one or both of the substrate or the over layer and/or to achieve the formation of the epitaxial material in the nanowires.

According to another embodiment of this invention, the first and second dopant materials are doped semiconductor materials.

According to yet another embodiment of this aspect of the invention there is provided a transistor comprising a complementary pair of transistors as described above which is formed by forming a dielectric layer over the nanowires and subsequently forming the gates of the transistor on top of the dielectric layer. Preferably, the transistor is made using complementary pair of transistors formed from two conversely doped semiconductors.

According to a specific embodiment of this invention, the method for making a complementary pair of transistors may comprise collimiating a first flux of atoms forming the fractional layer of dopant material and directing the first flux along the rising direction of the atomic steps at an angle that is substantially the same as the miscut angle of the substrate to form nanostripes at the inner edge of the atomic steps; and directing a second flux of atoms forming the fractional layer of dopant material along the descending direction of the atomic steps to form nanostripes at the outer edge of the atomic steps to form conversely doped nanostripes.

Subsequently, an over layer is deposited and an optional annealing step may take place to achieve diffusion of the dopant material into either or both, the substrate or the over layer and/or achieve the formation of the epitaxial material in the nanowires. The transistor comprises these nanostripes.

Alternatively, two gates could be formed from the two types of the semiconductor with converse type of doping e.g. the gate of the transistor with the p-type nanowire is of the n-type semiconductor and gate of the transistor of the n-type nanowire is of the p-type semiconductor. In this embodiment, the gate does not need to be separated from the nanowires by means of dielectric layer.

Optionally, the first dopant material may be a doped semiconductor material and the second doped material may be a doped semiconductor material. The first and second dopant may be the same or different. In this embodiment, an over layer is not required and the formation of the epitaxial material in the nanowires occurs after the optional step of annealing. The transistor is then formed out of the pair of nanowires, first the dielectric layer is formed over the nanowires and the gates are formed on top of the dielectric layer. Alternatively, the two gates are formed of two types of semiconductor with converse type of doping e.g. the gate of the transistor with the p-type nanowire is of n-type semiconductor and the gate of the transistor of the n-type is of a p-type semiconductor. In this embodiment, the gate does not need to be separated from the nanowires by means of a dielectric layer.

According to an fourth aspect of the invention, there is provided a method of preparing an array of conducting or semi-conducting nanowires comprising the steps of:

(a) forming a regular topographic pattern on a substrate by means of lithography, wherein the topographic pattern is one of an array of walls, a wave shaped topography, or other regular topographic pattern;

(b) depositing at a shallow angle with respect to the substrate surface a collimated beam of dopant material to form a fractional layer of dopant material positioned in correlation with the topographic pattern to form nanostripes (10);

(c) covering the nanostripes with an over layer (11) to form a multilayer structure; and (d) optionally annealing the multilayer structure to cause diffusion of atoms of the dopant nanostripes into one or both of the substrate and over layer to form nanowires.

According to another embodiment in this aspect of the invention, there is provided a method of preparing an array of conducting or semi-conducting nanowires comprising the steps of:

forming a regular topographic pattern on the substrate by means of lithography, wherein the topographic pattern is one of an array of walls, a wave-shaped topography, or other regular topographic pattern;

depositing at a shallow angle with respect to the substrate surface a collimated beam of doped semiconductor material to form a fractional layer of doped semiconductor material positioned in correlation with the topographic pattern to form nanostripes (10);

optionally annealing the multilayer structure to cause the establishment of epitaxial material in the nanowires.

According to this aspect of the invention, the nanowires may be formed on the vertical walls of a square wave shaped substrate. The substrate could be formed by, for example, preferential etching. Ideally, the walls of the square wave shaped substrate are approximately 5 nm to 10 nm wide and approximately 5 nm to 30 nm high, with an ideal separation of approximately 5 nm to 30 nm.

According to this aspect of the invention, the walls do not have to be vertical but could be tilted with respect to the direction orthogonal to the surface of the substrate.

Alternatively, the topographic pattern could be wave-shaped, for example, a sine-wave profile etched onto the substrate.

Preferably, the dopant material is selected from one or more of As, Sb, In, Ga, Al, P or B.

Ideally, the dopant material is deposited at a shallow angle on a portion of the vertical walls of the wave shaped substrate or the substrate containing an alternative topographic pattern. This ensures that the dopant material, due to the shadowing effect of the neighbouring walls, is only incident on a portion of the substrate. The over layer may then be deposited at an identical or substantially similar angle to the deposition angle of the dopant layer to result in a multilayer structure wherein the dopant layer is interposed between the substrate and the over layer. The dopant layer/over layer (multilayer) structure is then subject to an annealing step, for example thermal treatment, in a manner similar to other embodiments of this invention. Upon thermal treatment, the dopant material diffuses into one or both of the over layer and the substrate resulting in a doped nanowire.

The system may be left as is and the over layer may be used to generate strain in the nanowire thus effecting the carrier mobility with the aim to enhance carrier mobility. The strain is generated by lattice mismatch between the substrate and the over layer and therefore this can be controlled by choosing the correct combination of the substrate and the over layer.

According to a further embodiment of this aspect of the invention, the nanowires are exposed by preferential etching to remove any undoped material.

It will be understood that the method of this aspect of the invention takes place using identical or similar conditions and materials as the first aspect of the invention. For example, the substrate may be a semiconductor or an insulating material. The substrate may be selected from one of the following Si, Ge, Silicon on Insulator (SOI), MgO, SrTiO$_3$, MgAl$_2$O$_4$ or Al$_2$O$_3$.

Ideally, the dopant material is one of As, Sb, In, Ga, Al, B or P. Preferably, the dopant is either P or B. The doped semiconductor may be Si, Ge, or Si—Ge alloy doped with one of As, Sb, In, Ga, Al, B or P.

The over-layer may be an insulation material or a semiconductor material. Ideally, the over-layer is a layer of Si, Ge or SiGe alloy.

According to a preferred embodiment of the substrate and over layer are different materials. Preferably, the over-layer and substrate have different diffusion coefficients whereby diffusion of the material from dopant nanostripe is mainly or totally into the substrate or over-layer having a greater diffusion coefficient.

In yet another embodiment of the invention, spacer nanostripes are provided prior to applying the fractional layer of dopant material to form the nanostripes. This results in the application of the fractional layer of dopant material occurring on the exposed surfaces not covered by the spacer nanostripes. Preferably, the spacer nanostripes comprise a fractional layer of spacer material of low surface energy. "Spacer nanostripes" according to the invention will be understood to mean a fractional layer of spacer material of low surface energy which may be deposited on wall shaped substrate surface prior to depositing dopant material on the substrate.

The annealing time and temperature determine the extent of the diffusion of the dopant material from the nanostripes and therefore the diameter of the nanowires. Ideally, the annealing is for a relatively short period and in some embodiments of the invention, annealing will not be required.

It will be appreciated that in any method according to the invention, subsequent treatment may be required to expose the nanowires. In accordance with the invention the nanowires can be exposed by means of the etching the over layer using an etching process that is sensitive to the concentration of the dopant impurities, that is an etching process that removes the undoped areas of the over layer faster leaving exposed the areas into which the dopant material has arrived by diffusion.

Other details and process conditions from earlier aspects of the invention will also be applicable to this fourth aspect of the invention.

Furthermore, the nanowire according to this aspect of the invention is also suitable for the manufacture of various electric devices, in particular transistors such as field effect or junction transistors. These devices and their construction are described in relation to earlier aspects of this invention and also applicable to this aspect of the invention.

In one embodiment of this aspect of the invention, the field effect transistor is a back gate field effect transistor device.

According to this aspect, there is provided a method of making a back gate field effect transistor device with a gate and a channel using the nanowire made in accordance with the method of the invention wherein the transistor has a dielectric layer separating the gate from the channel comprising the steps of;

choosing a silicon on insulator (SOI) substrate with a heavily doped semiconductor layer underneath the dielectric oxide layer;

forming an array of walls or other topographic structure on the substrate with lithography;

depositing the dopant material by directing the collimated beam of the dopant material at a shallow angle with respect to the substrate surface;

depositing an over layer of semiconductor material to form a multilayer structure; and optionally, annealing the multilayer structure wherein diffusion of the dopant material into one or more of the substrate or over layer forms the nanowires and/or forms the epitaxial material of the nanowires.

In this embodiment, the doped layer of silicon underneath the oxide layer in the substrate serves as the gate of the transistor. The over layer and annealing step may be optional.

In accordance with all aspects of the invention, it will also be appreciated that during the deposition of the dopant material or doped semiconductor material, the substrate may need to be kept at a temperature substantially different from the room temperature. The optimal temperature depends on the material combination used in the deposition. The elevated substrate temperature is routinely used during the growth of the epitaxial materials to obtain better quality of the epitaxial growth.

DETAILED DESCRIPTION OF THE INVENTION

The invention can be more clearly understood from the following description of some embodiments thereof, given by way of example only with reference to accompanying drawings in which:

FIG. 1. is a perspective view of a typical vicinal surface of a substrate;

Figure 1:
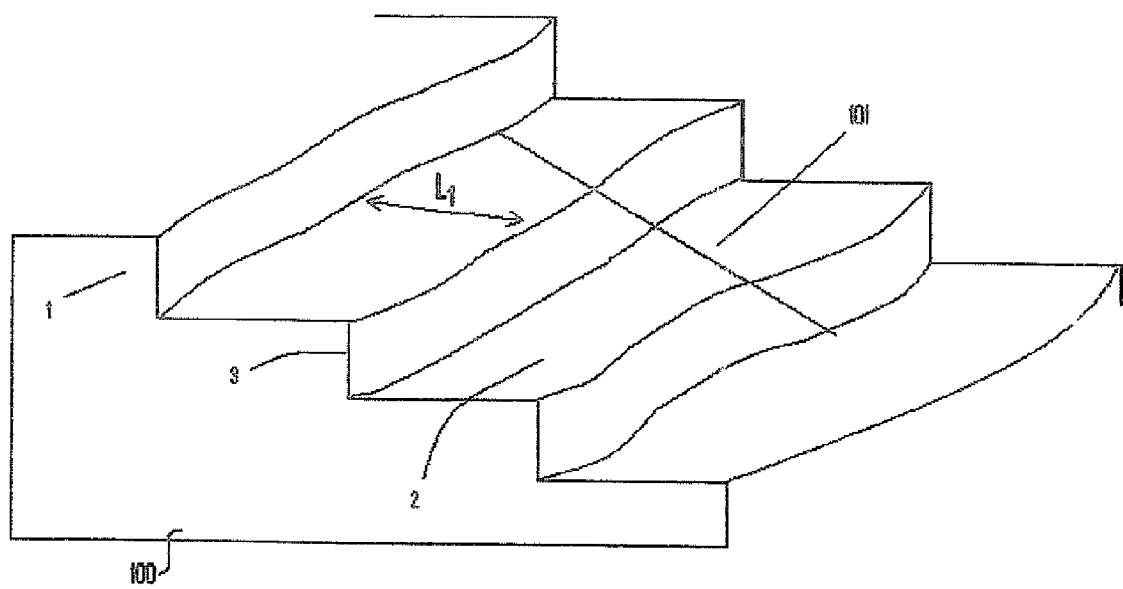

In this specification the term "vicinal" is used not simply in its common meaning of "neighbouring" or "adjacent" but also as a reference to the characteristics of the terraces formed by the subsequent treatment of a miscut substrate. Thus, the phrase "the extent to which the substrate is vicinal" implies, as will be appreciated by those skilled in the art, how this substrate can be represented as the array of flat areas, called terraces, with rising or descending steps in between these areas, called terrace steps and also will reflect the straightness of the terrace steps and the extent to which the direction of the rising/falling steps is maintained throughout a large number of steps and macroscopic areas of the substrate. There is no one term, which can describe how the vicinal substrate is treated to achieve the desired terraces, so much depends on the substrate material. This is explained in detail in the specification. Accordingly, "the extent to which the substrate is vicinal" means the materials are chosen, various miscut angles are used, various treatments of the cut surface are performed, and an optimum cut angle and treatment is determined to provide the necessary interaction between the film and the substrate to achieve the objects of the invention. Because the materials are changed and the treatments will vary, all one can state is that the optimum cut angle and treatment is used to provide this vicinal surface, as again described in the specification. A convenient term for this could be "vicinal treatment" or "vicinally treated" to cover choosing for the combination of film and substrate, the correct miscut angle and miscut direction, and the subsequent treatment of the substrate to provide the necessary nanowires in accordance with the invention.

In this specification the term "film" and "layer" are used interchangeably. In this specification a film or layer, in which the aerial density of atoms is lower than the aerial density of atoms within each terrace of the surface, is called fractional layer.

Such a film does not cover totally the surface to which it adheres, leaving the areas of the bare substrate. One can also say that the fractional layer is a film with the nominal thickness below one monolayer. Therefore in this specification, the film with the nominal thickness of one monolayer is the film, in which the aerial density of the atoms is equal to the one of the substrate. It should be pointed that one could use as well the second convention in which one monolayer thick film is defined as the film with the aerial density of atoms in the film equal to the aerial density of atoms in the atomic plane of the film material in the bulk parallel to its surface. For example, suppose the aerial density of atoms in the substrate A having (100) Miller index orientation is $2.5 \times 10^{19}$ atoms/m$^2$. Suppose the film of the material B grows on the substrate epitaxially also resulting in the (100) Miller index surface. Suppose the aerial density of atoms in the (100) surface of the material B is $1.25 \times 10^{19}$ atoms/cm$^2$. In this case the layer that is considered as the closed monolayer according to the second convention is equivalent to half the monolayer according to the first convention. Depending on the specific choice the materials A and B and depending on whether or not the growth is epitaxial, either the first or the second convention could be more convenient. However, for clarity we will adhere to the first convention.

Figure 2:
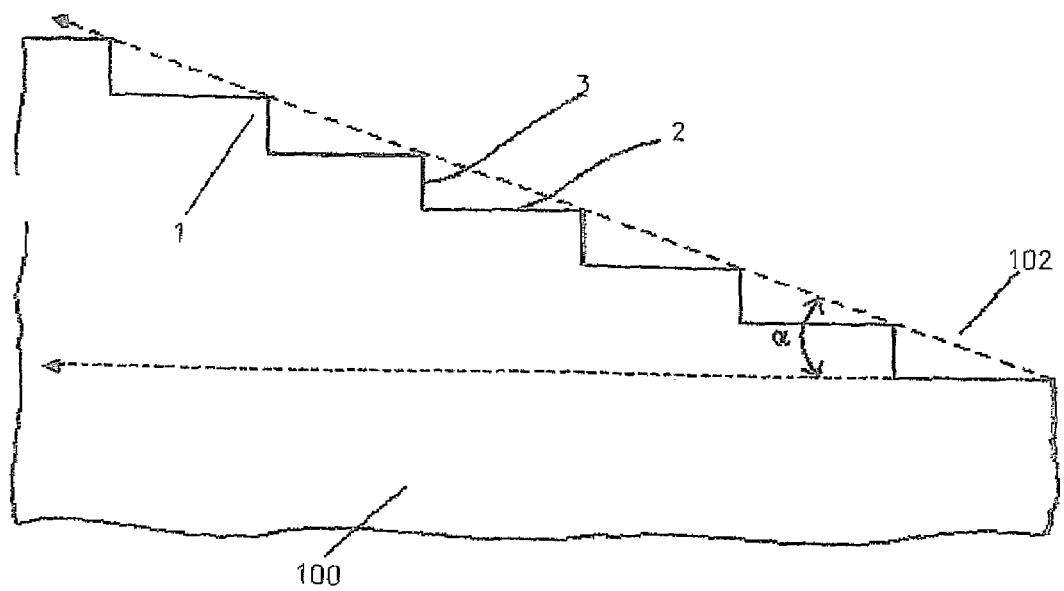
FIG. 2 is a cross-section perpendicular to the terrace steps of the vicinal substrate.

There is also difficulty in nomenclature when one refers to "vicinal surfaces" "atomic terraces" and "terrace steps". The "vicinal surface" consists of "atomic terraces". Therefore, each atomic terrace is a relatively flat area of the vicinal surface. As it will be explained below, in practice atomic terraces are not perfectly flat and contain atomic corrugations, defects, adsorbates, and atomic scale reconstructions, however, at this point this is not essential. The separation between the neighbouring terraces in the vertical direction, i.e. in the direction perpendicular to the atomic terraces is called terrace step. The dimension of the terrace step is typically comparable to the separation between the layers of atoms parallel to the atomic terraces (typically 2 A, the same as 0.2 nm, the same as $2 \times 10^{-10}$ m), although it can be a multiple of this in the case of bunched steps or multiple steps. For example, it could be a double of, quadruple of, or even tenfold of the separation between the layers of atoms in the crystal structure. On the other hand, the width of the atomic terraces is typically considerably greater than the interatomic distance, e.g. it could be at least 1 nm or more typically 10 to 50 nm or even greater than 100 nm. This is shown in FIGS. 1 and 2 and discussed in more detail below. However, in order to make the figures more readable, the widths of all the atomic terraces are typically shown disproportionably reduced. For example, in FIGS. 1 and 2 the width of the atomic terraces is only shown to be some three times greater than the terrace steps which would make them only 0.6 nm wide, that is to say they are exceptionally narrow terraces in practical terms. In a vicinal surface, the direction of the rising steps typically persists unchanged over a relatively large area. For example, the step to the left is always a rising or always a falling step throughout many atomic terraces. It should be appreciated that the order of subsequently rising or subsequently falling steps is not perfectly preserved between all the atomic terraces. For example, in a typical vicinal surface rising steps may be followed by one or two falling steps and then by a number of rising steps, etc. It should be appreciated that macroscopically a vicinal surface is typically not exactly parallel to the individual atomic terraces.

FIGS. 1 and 2 show schematically an example of a vicinal substrate 100 terminated in vicinal surface, indicated generally by the reference numeral 1. The vicinal surface 1 consists of terraces with low Miller indexes called in this specification, atomic terraces 2. The atomic terraces 2 are separated by terrace steps 3 in the vertical direction, i.e. in the direction perpendicular to each atomic terrace. The terrace steps are also identified by the reference numeral 103 in some of the drawings. Vicinal surfaces can be formed for numerous crystalline materials. Atomic terraces can be formed to have various Miller indexes, e.g. (100), (110), (111) are common indexes for atomic terraces. Terraces with certain indexes can be formed readily, terraces with other indexes cannot. This depends on the surface energy of different atomic terraces, which in turn depends on the crystal structure of the material. Atomic terraces can readily be visualized by means of a Scanning Tunneling Microscope (STM) on electrically conducting materials and by means of an Atomic Force Microscope (AFM) on conducting and insulating ones. Many researchers including some of the inventors have studied atomic terraces extensively, e.g. [S. Murphy, D. M. McMathuna, G. Mariotto, I. V. Shvets, Physical Review B 66 (19) 195417 (2002), "Morphology and strain induced defect structure of ultrathin epitaxial Fe films on Mo(110)"]. The vicinal surface is characterized by the miscut direction, giving the mean direction of the terrace steps. For the purpose of this specification we shall define the miscut direction as the direction perpendicular to the mean direction of the step edges. The miscut direction in FIG. 1 is schematically marked with straight line indicated with numeral 101. For example, the (001) surface in principle may have terrace steps aligned along the <100> or <110> crystallographic direction or along numerous other directions. Again, in practice certain crystallographic directions of the terrace steps can be readily attained and others cannot. The result depends mainly on the crystallographic indexes of the atomic terraces and the type of material that could favour some directions over the others due to lower step energy. It should be appreciated that for most surfaces the terrace steps are not perfectly straight. Nonetheless, for many surfaces the average representative direction of the terrace steps can be readily identified. Each terrace is characterized by the terrace width. In FIG. 1, the terrace width of one of the terraces is shown as $I_1$. It is clear that the same terrace at different locations may have different widths, as the terrace steps in practice often do not form perfectly straight lines parallel to each other. Nonetheless, the average representative terrace width can often still be identified for the surface. This is related to the so-called average miscut angle. The miscut angle is identified in FIG. 2 by the letter $\alpha$ and can be loosely defined as the angle between the atomic terraces 2 and the overall surface direction 102. FIG. 2 represents a cross-section of the surface perpendicular to the terrace steps. Generally the greater the miscut angle, the smaller is the average width of atomic terraces. In practice the relative width $I_7$ of the terrace 2 is many times greater than the height of the step 3 and not as shown in FIGS. 1 and 2, as explained above.

It should emphasized that the vicinal (100) surface that is e.g. off-cut from the (100) surface strictly speaking is no longer the surface with the (100) orientation. Strictly speaking the overall mean orientation of the miscut surface is characterized by another set of indexes. For example, it could be surface with the indexes (2001) even though each atomic terrace within the surface is still characterized by the (100) Miller indexes. However, for simplicity in this specification we shall call this surface vicinal (100).

Methods of forming vicinal surfaces have been extensively described in the literature. Generally, the methods are based on cutting the surface at a desired angle with respect to the low index direction by diamond saw, spark erosion or another suitable technique and polishing the surface, e.g. by using diamond paste, or by means of electrochemical polishing. Then the surface is characterized by means of a high-resolution x-ray diffractometer (HRXRD). The procedure for measurement of the miscut angle is well known to those skilled in the art. We refer to PCT Patent Application No. PCT/IE04/00034 as filed by the present applicants.

To establish terraces on a miscut substrate, treatment leading to the atomic scale rearrangement is often required. According to one method, the surface may be annealed in vacuum or in ultra-high vacuum. In between the annealing sessions it can be characterized by in-situ scanning tunnelling microscopy (STM) i.e. the STM located inside the vacuum system. Again, as a background information on the prior art, we could refer to publications by some of the inventors of the present application, e.g. (S. Murphy, G. Mariotto, N. Berdunov, I. V. Shvets Phys. Review B, 68 Art No165419 (2003)), Another method includes ion etching of the surface kept at an elevated temperature by means of e.g. Ar ions in vacuum [P. Naumann, J. Osing, A. Quinn, I. V. Shvets, "Morphology of sputtering damage on Cu(111) studied by scanning tunnelling microscopy", Surface Science 388 (1997) 212-219] which is included in this specification by way of reference. Alternatively, a chemical reaction can be set up on the surface such that the reaction speed is dependent on the Miller indexes of the atomic terraces. As a result, well-defined terraces can be formed. In some cases it is beneficial to anneal the substrate by driving current through it. In some cases the direction of the current with respect to the miscut direction is important for the formation of the atomic terraces (A. Sgarlata, P. D. Szkutnik, A. Balzarotti, N. Motta, F. Rosei, Applied Physics Letters, 83 4002 (2003). Another example of a procedure for describing formation of vicinal surface can be found in the study of $SrTiO_3$ (100) surface (K. Sudoh, H. Iwasaki, Surface Science Letters 557 L151 (2004). Other possible methods also include subjecting the surface to chemical or electrochemical reaction. There is no general hard rule of finding the conditions for the preparation of a vicinal surface with well-defined terraces. The conditions are generally optimised for any given material and desired Miller indexes of the atomic terraces.

Figure 3:
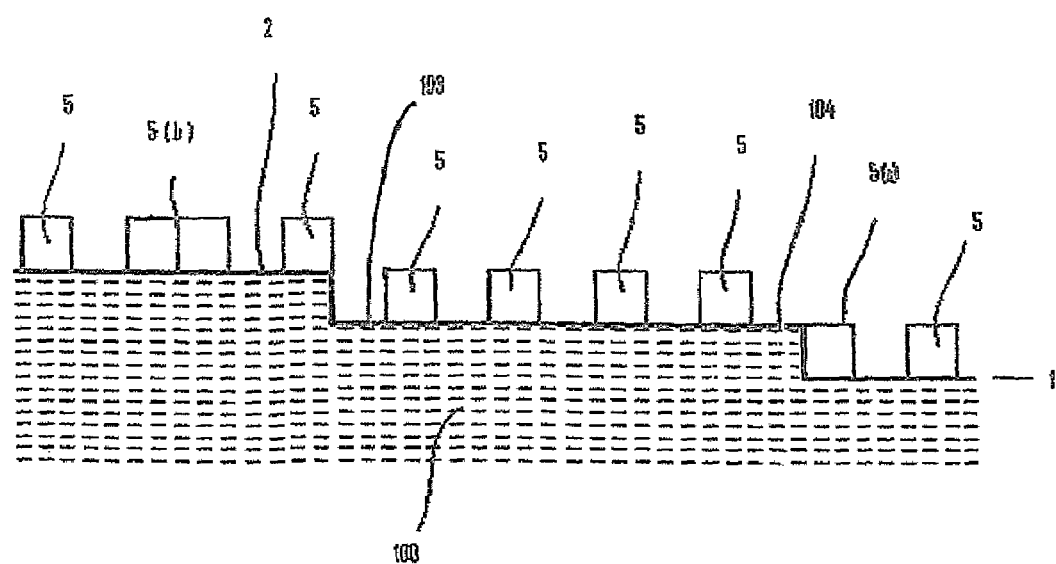
FIG. 3 is a schematic representation of adatoms of a layer deposited on the substrate before they arrive at equilibrium positions. Adatoms located at the outer and inner edges of a terrace step are shown.
Figure 4:
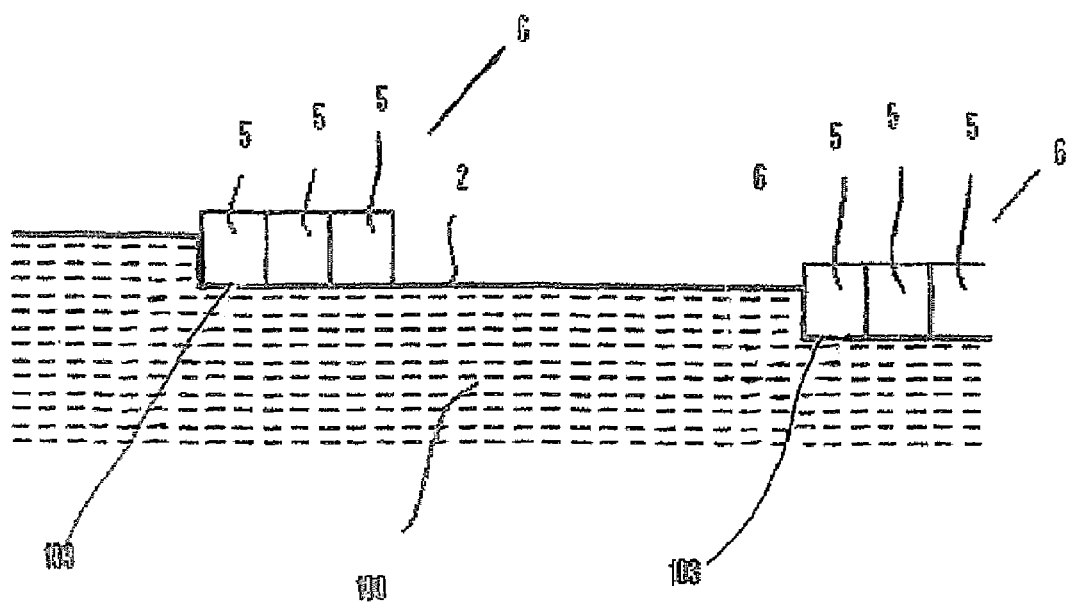
FIG. 4 shows formation of the closed fractional layer at the inner edges of terrace steps.
Figure 5:
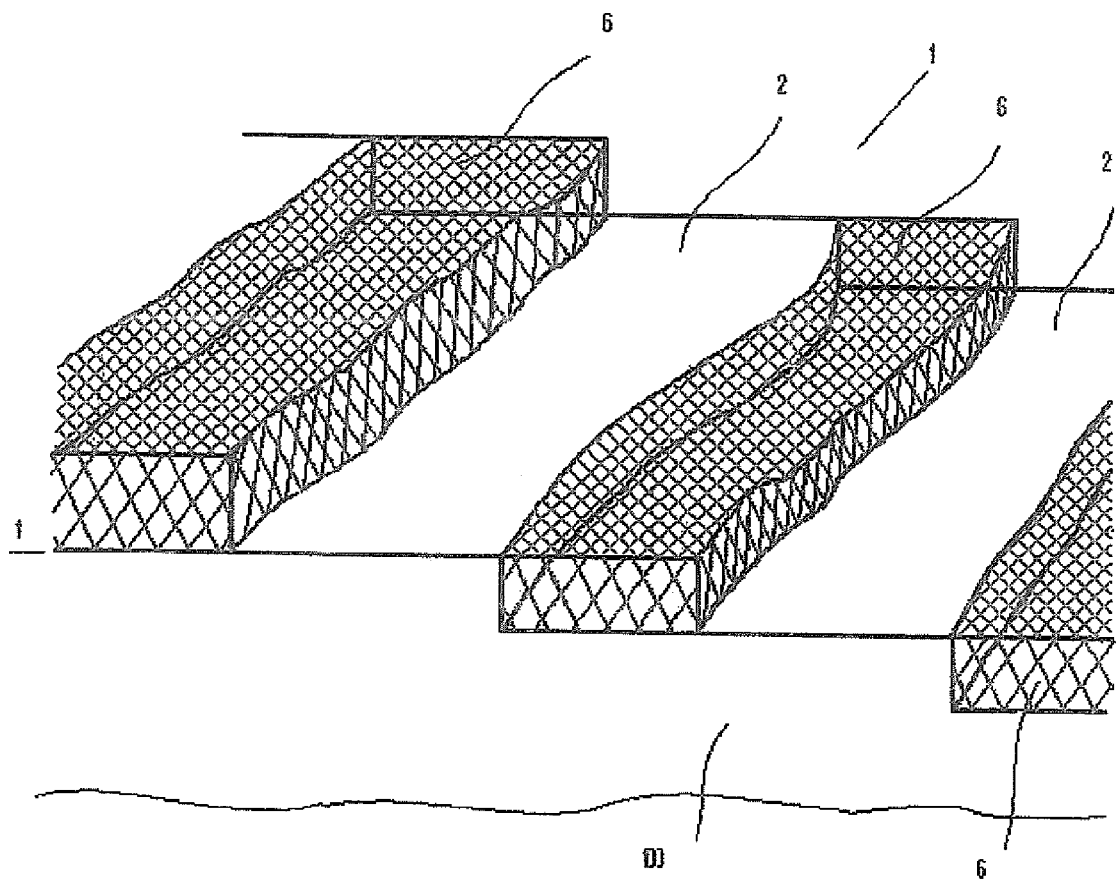
FIG. 5 is a perspective view of a closed fractional layer formed at the inner edges of the terrace steps.

Referring to FIG. 3, there is illustrated a vicinal substrate, again identified by the same reference numeral 100. The substrate is terminated in vicinal surface, indicated generally by the reference numeral 1. FIG. 3 shows atoms 5 of a thin film randomly deposited on the vicinal surface 1. Such almost randomly distributed atoms can move on the surface to reach the position of equilibrium or quasi equilibrium. These atoms are called adatoms. If the temperature of the substrate is not high enough to promote mobility of adatoms 5 on the surface, then they form clusters 5b and single adatoms 5 almost randomly distributed around each atomic terrace 2 of the surface 1. When the substrate temperature increases the mobility of the adatoms also increases. At high enough temperature the adatoms 5 migrate throughout the surface 1 arriving to the positions of the lowest energy. Usually, these are the positions with the highest coordination number, i.e. the highest number of atoms in the immediate vicinity of an adatom 5. On a terraced surface these are often the positions at the inner edge of each terrace 2, namely the step 103. One such atom located at the inner edge of a terrace is indicated with the numeral 5(a). In some materials the position of the lowest energy for the adatoms is at the outer step edge 104 of the atomic terrace. Besides, on a terraced surface 1, the movement of adatoms 5 is usually limited within the boundaries of each atomic terrace 2. The reason is that the movement of an adatom 5 between the atomic terraces requires overcoming a significant energy barrier. As a result, the adatoms 5 rearrange themselves on each terrace 2 migrating in the context of FIG. 3 leftwards on average (if the direction of the miscut is reversed, then the direction of the adatoms migration is also reversed). In this way the adatoms can form a closed fractional monolayer, identified by the reference numeral 6, as shown in FIG. 4, the boundary of which is moving rightwards. In FIG. 4, parts similar to those described with reference to the previous drawings are identified by the same reference numerals. If half the nominal monolayer is deposited on the surface 1, then approximately half of each atomic terrace 2 is covered by the closed fractional monolayer 6. This does not depend on the width of the atomic terrace: the greater is the width of the terrace, the greater is the number of adatoms 5 deposited on it. In other words, the number of adatoms 5 caught by atomic terrace 2 from the flux in the evaporator is proportional to the area of the terrace 2. A perspective view of the fractional closed layer is schematically shown in FIG. 5.

Figure 6:
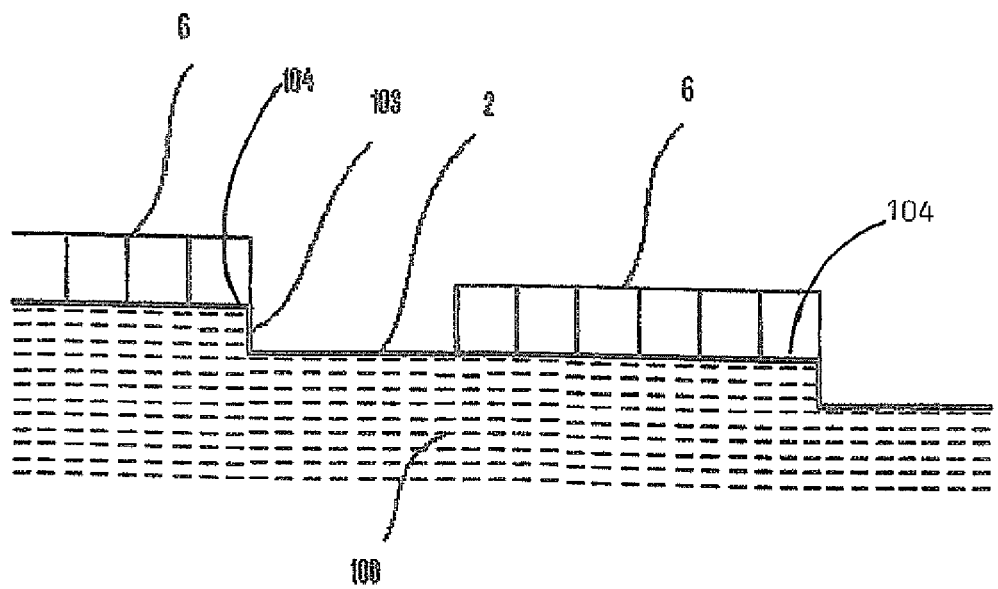
FIG. 6 is a diagrammatic representation of portion of another array of nanowires during its formation with a closed fractional layer at the outer edges of the terrace steps.

For certain combinations of materials forming the substrate 100 and nanowires, the migration of adatoms 5 takes place not towards the inner edge of the terrace 2 but rather towards the outer edge 104 as shown in FIG. 6. Again, parts similar to those described with reference to the previous drawings are identified by the same reference numerals. Whether the formation of the fractional layer 6 takes place at the inner edge or outer edge depends on the bonding characteristics of the adatoms 5 when placed on the surface 1. Then in terms of FIG. 3 adatoms 5 move rightwards on average. FIGS. 3, 5, 6 show the adatoms 5 of the material forming the fractional layer as rectangles with the height greater than the height of the terrace step 3 of the substrate 1. This is to reflect the fact that the materials forming the substrate 1 and the fractional layer 6 consist of different atoms having different atomic radii. This forms either a positive or a negative fractional step. Example of positive fractional step is shown in FIG. 4. Observation of these steps has indeed been reported in the literature [S. Murphy, D. MacMathuna, G. Mariotto, I. V. Shvets, "Morphology and strain-induced defect structure of ultrathin epitaxial Fe films on Mo(110)", Physical Review B, 66 195417 (2002)].

If the substrate with adatoms scattered around atomic terraces is annealed after the deposition, the adatoms may rearrange into a closed fractional layer. Similar morphology of the closed fractional layer is achieved for some substrate-adatom material combinations if the substrate is kept during the deposition at an elevated temperature. As explained above, in this case the positions of the step edges continuously change as the growth progresses and more adatoms are incorporated into the closed fractional layer so that the edges of closed fractional layer at each atomic terrace move as the growth progresses. This kind of growth is known as step flow growth. The step flow growth is easily achieved for homoepitaxial growth, e.g. growth of Si on Si surface or Au on Au surface. It can also be achieved, especially for the fist few monolayers of the film if the film and substrate materials are relatively similar, e.g. growth of Ge on Si.

It should also be pointed that for many materials the growth in the equilibrium does not form the step flow growth mode. Indeed much depends on the surface energies of the film, substrate and the interface. Generally if the surface energy of the film is significantly lower than that of the substrate, the step flow growth mode may be difficult to achieve. In some cases the step flow growth may require too high a temperature at which the film material alloys/reacts with the material of the substrate or even diffuses into bulk of the substrate. Therefore in these cases the step flow growth also cannot be achieved in practice.

It should also be pointed that the closed fractional layer may also contain numerous defects including vacancies, dislocations, nucleations of the next layer of the film, etc.

Figure 7:
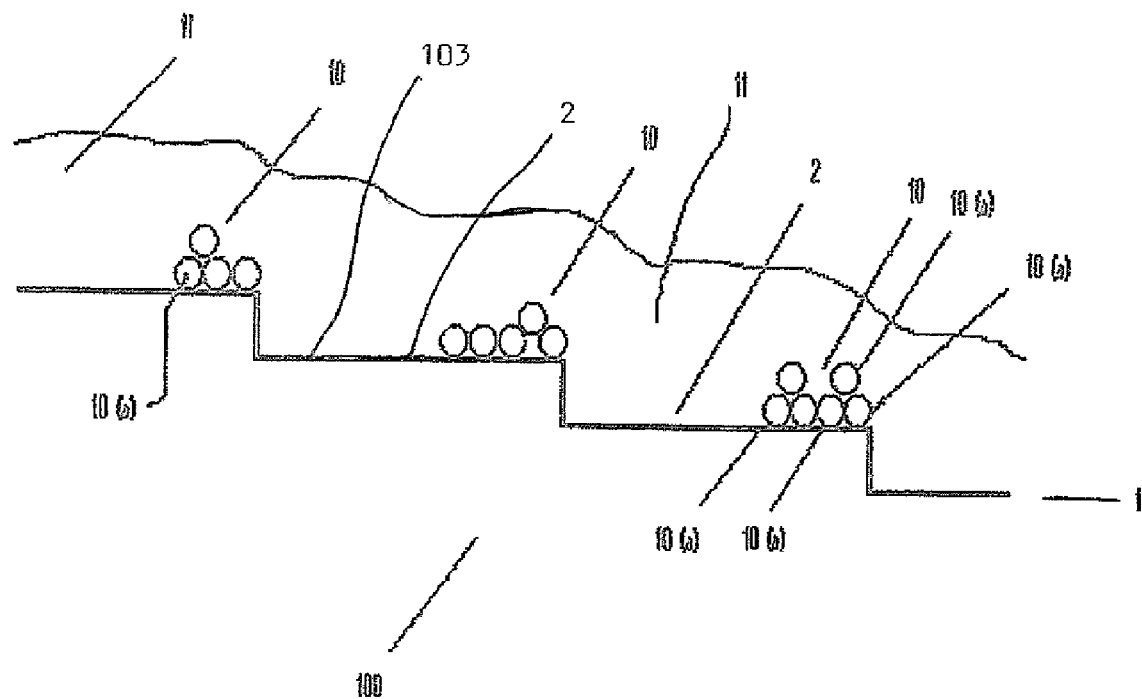
FIG. 7 is a diagrammatic representation of an intermediate step in formation of the nanowire array.
Figure 8:
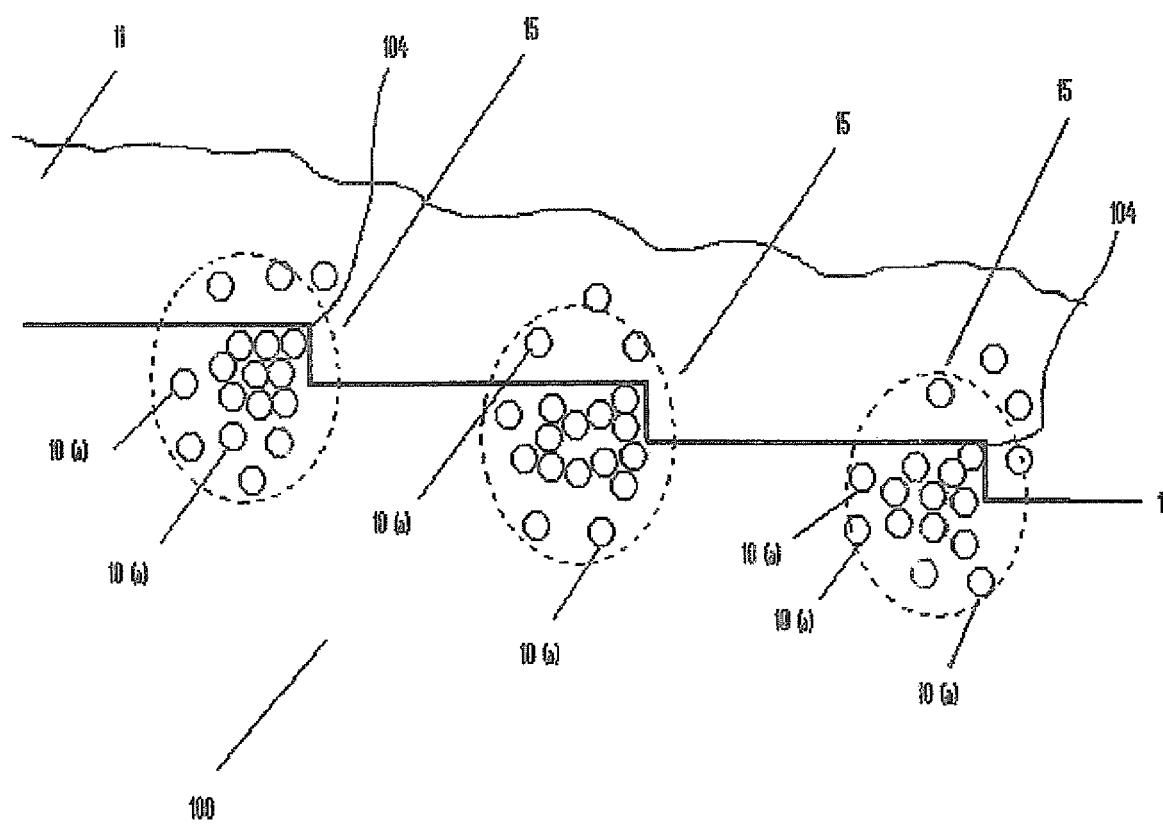
FIG. 8 is a diagrammatic representation of the nanowire array.

With the above comments on the prior art as background information, the invention will now be described with reference to FIGS. 7 and 8. There are various embodiments that will effectively show identical drawings as FIGS. 7 and 8, although they are made up of different materials. Accordingly, FIGS. 7 and 8 are used to describe many embodiments of the invention. This is done to avoid confusion. Further, in FIGS. 7 and 8, parts similar to those described with reference to the previous drawings are identified by the same reference numerals. Referring now to FIGS. 7 and 8 to describe the first embodiment of the invention there is provided a substrate having at least an upper part which is of a semiconductor material to form a vicinal semiconductor surface. This could also be e.g. Ge or Si with vicinal (111) surface or vicinal surface with other Miller indexes. It could just as well be an insulating substrate on which epitaxial film of semiconductor is deposited in such a way that it forms a vicinal surface. A suitable dopant material such that it can form donor or acceptor type (n-type or p-type) impurities in a semiconductor material is provided. There are many dopant materials known to those skilled in the art of semi-conductor technologies, as well lists of semiconductor materials used in combination with such dopant materials. Then, a fractional layer of this dopant material is placed on the terraces 2, as described already. It thus forms dopant nanostripes 10. The nanostripes 10 contain dopant impurities identified by the reference numeral 10($a$). The nanostripes 10 can grow either at the inner or at the outer steps of atomic terraces 2. Both configurations are acceptable. It is even acceptable to have the situation where on each atomic terrace 2 the fractional layer forms two nanostripes: one at the inner position against the step 103 and the other at the outer step edge 104. This latter configuration would be highly unusual which may only be achieved for very few exceptional film-substrate material combinations. Yet, such an exceptional combination is still acceptable for the working of this invention. As explained in the review of the background information, the fractional layer means that the width of the dopant nanostripes 10 is smaller than the width of the atomic terraces 2 on which they are positioned. For example, their widths could be 0.01 or 0.1 or 0.8 fraction of the widths of the respective atomic terraces on which the nanostripes 10 are positioned. In a typical embodiment, as mentioned above, the material of the dopant nanostripes 10 is such that it can form donor or acceptor type (n-type of p-type) impurities in a semiconductor material. For example, this could be As, Sb, In, Ga, Al, B or P (or indeed some other materials) if the semiconductor material is Ge or Si.

Although there are numerous models describing conditions favouring various growth modes, their quantitative accuracy of predictions is often questionable. Therefore, the most reliable way of finding the correct conditions for the growth of semiconductor nanostripes is empirical: the temperature of the substrate and the film deposition rate must be optimised experimentally to achieve the growth correlated with the terrace steps. The required temperature depends on the materials of the substrate and the film, crystallographic direction of the substrate and also to a certain extent on the width of the atomic terraces and also on the deposition rate of the material. Generally, the greater is the deposition rate, the greater is the required substrate temperature. It should be noted that having too high a temperature of the substrate might be of disadvantage as at some temperature interalloying of the substrate material and material of the film may take place during the deposition. In this way the material of the film may bury itself in the substrate and create no nanostripes on the surface. A convenient way of optimising the growth conditions comprises of checking the structure of the films using a Scanning Tunnelling Microscope (STM) or an Atomic Force Microscope (AFM). The optimisation procedure typically consists of keeping the deposition rate constant, e.g. at the value of 0.03 nm to 10 nm per minute. This deposition rate should only be used as an example. Then a number of films are deposited at various substrate temperatures. Film grown at each temperature is characterized by means of STM or AFM. An example of such a study aimed at establishing the conditions for the epitaxial growth can be found in the publication by some of the inventors included here as background information although it should be kept in mind that different materials combination was used with the Mo(110) surface as the substrate [S. Murphy, D. M. MacMathuna, G. Mariotto, I. V. Shvets, Phys. Review B 66 Art No 195417 (2002)].

It should also be noted that the closed fractional layer forming the dopant nanostripes 10 does not have to be closed in the full sense of the word, i.e. there can be gaps, holes and missing atoms in it. What is important is that the difference is formed between the substantially bare parts of the atomic terraces and those parts that are substantially covered by the dopant nanostripes 10. Likewise, the nanostripes 10 may be composed of areas with the local thickness greater than one monolayer.

Then the layer of dopant nanostripes is covered by the over layer 11 forming the multilayer structure as shown in FIG. 7. The over layer 11 could be a semiconductor material but could also be an insulating material. Then the thus formed multilayer structure can be subjected to treatment leading to diffusion of elements of dopant nanostripes in the areas neighbouring to these. In this way the areas of semiconductor with dopant impurities in them form wires preferentially aligned along the step edges. These areas position in the vicinity of the dopant nanostripes. As the dopant nanostripes form a regular array of relatively equally spaced one dimensional structures, the entire structure then forms an array of doped semiconductor areas with the cross section in the range of nanometers or some tens of nanometres, i.e. nanowires. Typically such a treatment leading to the diffusion of the dopant nanostripes is a short anneal. The temperature and the duration of the anneal need to be established empirically. As a starting point in the search for the anneal temperature and anneal time one could use the data from the semiconductor device manufacturing industry. This will be known to those skilled in the art of semiconductor device manufacturing. Preferably, the anneal time should be rather short. The rationale for this is: the longer is the anneal time, the greater is area of diffusion. Therefore at rather long anneal time, the dopant nanostripes will diffuse around subsurface region forming two-dimensional profile of the dopant impurities in which the impurity concentration depends essentially on one coordinate, distance to the surface. Annealing the dopant nanostripes before the over layer 11 is deposited on them may result in a completely different situation to the one where anneal occurs after the deposition of the over layer. The over layer 11 serves as an additional tool to suppress the lateral diffusion of the elements forming dopant nanostripes around the surface of the substrate. If the over layer 11 and the substrate are different materials and if the diffusion coefficients of the dopant impurities 10(a) are substantially different in these two materials, then the material of the dopant nanostripes will preferentially diffuse into the material with higher diffusion coefficient.

Referring now to FIG. 8, in which parts similar to those described with reference to the previous drawings, are identified by the same reference numerals, this formation of the nanowires is presented schematically with the nanowires being shown by interrupted lines and identified by the reference numeral 15. In FIG. 8, there is shown the situation where annealing has taken place and the nanowires, identified by the reference numeral 15 and the interrupted lines, have been formed.

Figure 9:
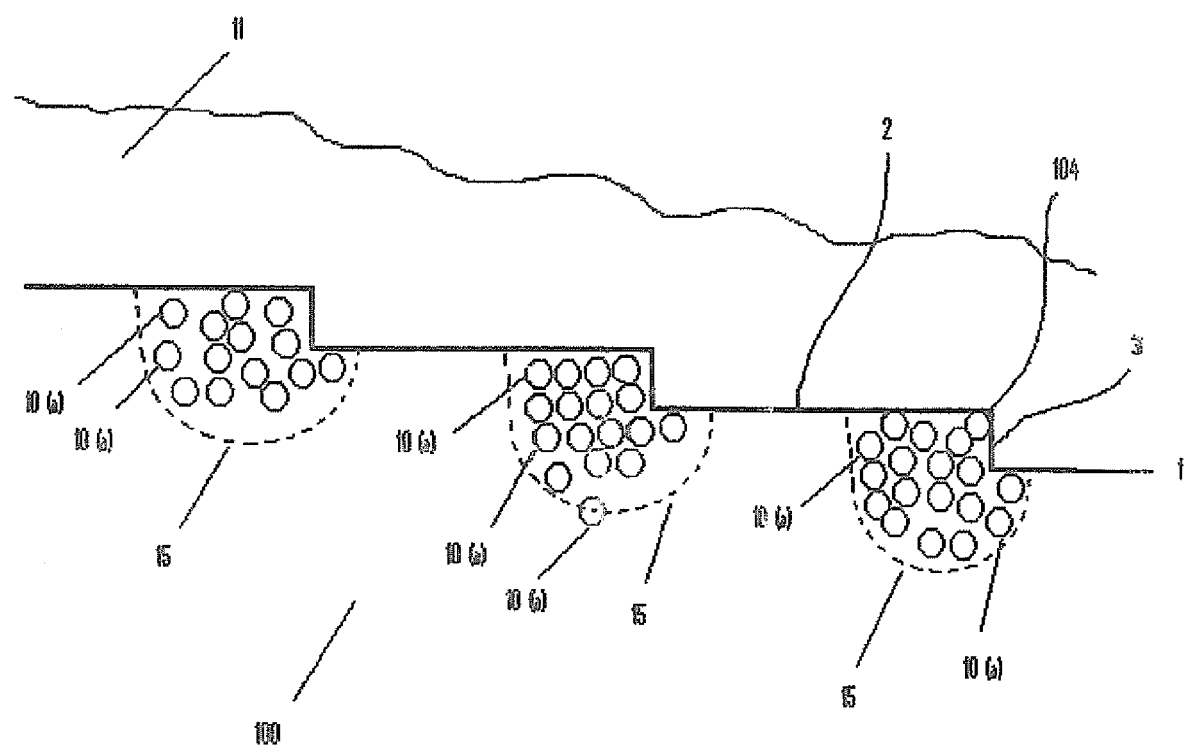
FIG. 9 shows another embodiment of the nanowire array.

FIG. 8 shows the situation where the diffusion coefficient of the dopant impurities 10(a) in the substrate 100 is greater than the one in the over layer 11. FIG. 9 shows the extreme case related to this embodiment when the diffusion coefficient in the over layer 11 is negligibly small. In this case all the dopant nanostripes diffuse into the substrate, thus forming semiconductor nanowires 15 in the substrate 100.

Figure 10:
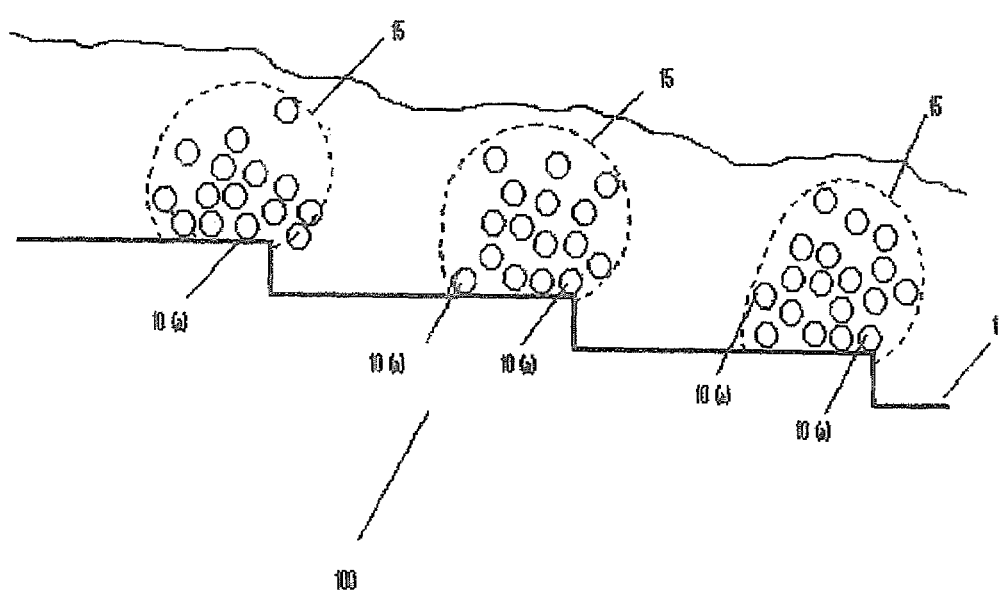
FIG. 10 shows another embodiment of the nanowire array.

In another embodiment also with reference to FIGS. 7 and 8, the vicinal substrate 100 is not of semiconductor material but rather of an insulating material, e.g. MgO, $SrTiO_3$, $MgAl_2O_4$, $Al_2O_3$ etc. In this embodiment the over layer 11 is of semiconductor material. In this embodiment the semiconductor nanowires 15 are the areas of doped over layer 11. The array of semiconductor nanowires 15 is formed in which these are aligned parallel to the step edges 3 of atomic terraces 2 of the vicinal substrate. FIG. 10 shows the extreme case related to this embodiment when the diffusion coefficient of dopant atoms 10(a) in the substrate 11 is negligibly small.

It should be appreciated that with some substrate materials, the dopant impurities could diffuse into the substrate and still make no significant changes to its electrical conductance. This will be readily appreciated by those familiar with semiconductor physics. The outcome depends on the electronic band structure of the substrate material. Generally the insulating materials stay insulating even when moderate concentration of impurities is established in them. This is different to a semiconductor material where small concentration of dopant impurities may significantly change its conductance.

It should be pointed out that in some embodiments it may not be necessary to anneal the multilayer structure. Indeed the dopant nanostripe embedded into a semiconductor material or placed in contact with semiconductor material still forms a nanowire. Clearly, the electronic properties of such a nanowire are different to ones in the nanowires formed by diffusion of dopant impurities around a greater area of semiconductor. Nonetheless a nanowire array can still be formed by an array of dopant nanostripes placed in proximity of the semiconductor surface.

It is also clear to those skilled in the art that additional layers can be added to these structures. For example, these could include the protection layers, the layers of oxides. We shall not discuss these in detail but rather focus on the key point of the invention—the formation of the dopant nanostripes and nanowires.

It should be mentioned that the nanowires could be constructed with the use of "undoping" material. The term "undoping" is relatively common in semiconductor technology although not as common as the term doping. It refers to the situation when impurity establishes deep level acting as traps of electrons or holes in the material and thus increasing its resistance. For example, in the case of Cr doping in GaAs, the conductance of the material can be lowered by the presence of impurities when compared to the pure material. In the present invention the dopant impurities could be of such an undoping material leading to the formation of the areas of high resistance positioned along the direction of the terrace steps. This could be termed anti-nanowires.

With reference to FIG. 7, it can be used to illustrate an embodiment in which the substrate and the over layer are nanostripes and the dopant nanostripes are conducting pathways supported by such insulating substrates. In this case the dopant nanostripes themselves form the nanowires.

Figure 11:
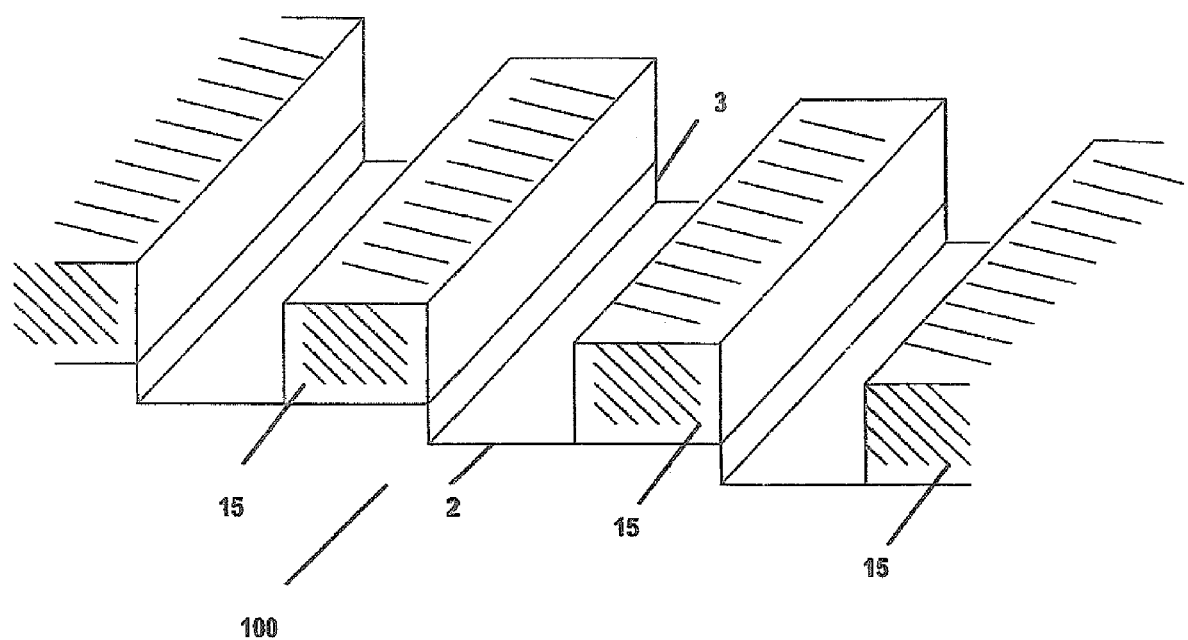
FIG. 11 shows another embodiment of the nanowire array in which the nanowires are exposed.

Following the formation of the semiconductor nanowires, the film containing the array of the semiconductor nanowires can be subjected to treatment exposing the nanowires. For this the semiconductor material that is not doped, is removed from the structure. Those skilled in the art of semiconductor devices know that there are a number of routine processes that allow for different rate of removal of doped and undoped semiconductor material from the surface or for different rate of removal of material with different type of doping. The array of exposed semiconductor nanowires 15 is shown in FIG. 11. It should be appreciated that the thickness of exposed nanowires could be much greater than one monolayer even though the dopant nanostripe could only be in some cases one or two monolayers thick. This is because as a result of the anneal, the dopant nanostripe could diffuse into a relatively large area of the size of some 1 nm or even 10 nm or greater. As a result the rate of material removal (etch rate) of relatively large area of Si could be affected, again of the size of 1 nm, 10 nm or even greater.

Figure 12:
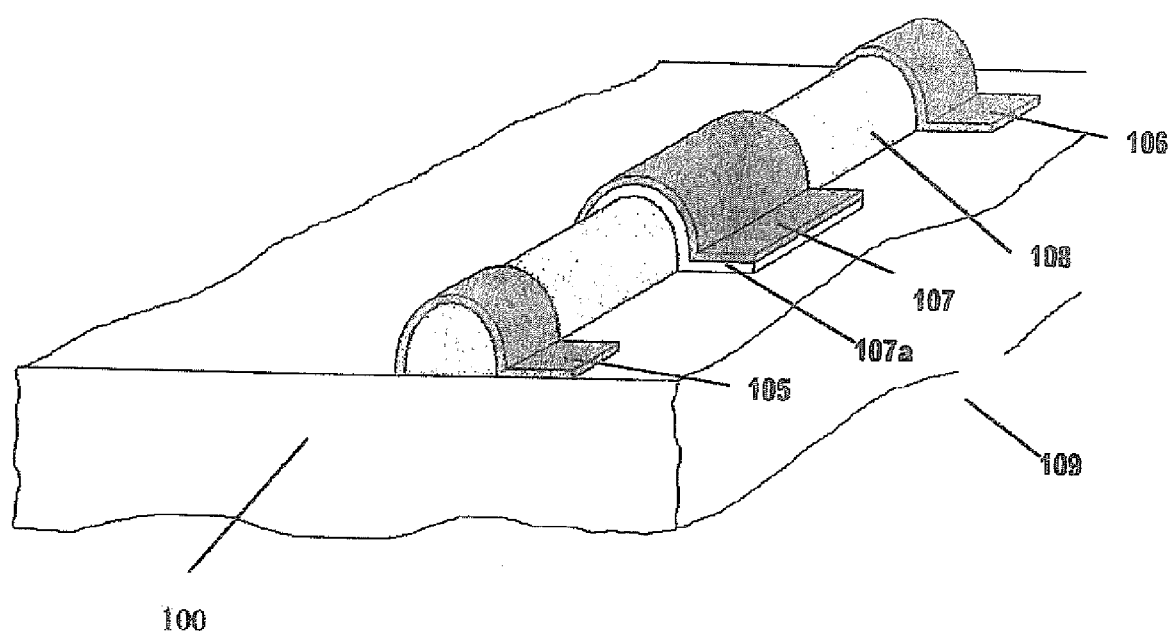
FIG. 12 shows the transistor device that is based on the nanowires formed according to the invention

The arrays of nanowires could be employed for making a number of electronic devices. These devices are widely described in the literature on nanowires and therefore we limit ourselves in this specification to just a single example: field effect nanowire transistor. This is shown in FIG. 12. A drain 105 and a source 106 of a transistor, indicated generally by the reference numeral 109, are located at two ends of a nanowire 108 and a gate 107 is in the middle. The drain and the source could be the layers of semiconductor material doped in the same way as the doping of nanowire 108 or with opposite type of dopant. This will be clear to those skilled in the art and will result in different varieties of the transistor such as enhancement mode or depletion mode, or in other terms transistor with majority carriers and minority carriers in the channel. There is a further layer 107(a) which could be a dielectric layer (e.g. oxide, nitride, etc). The dielectric layer 107a may spread beyond the boundaries of the area 107 to ensure that there is no electric contact between the layer 107 and the nanowire 108. To enhance the transistor on/off current ratio, the gate 107 is enveloped on three sides of the nanowire 108 as shown in FIG. 12. This is only an example and the gate may as well be located on a single side of the transistor. The embodiment of FIG. 12 does not show any atomic terraces and step edges for simplicity. In some embodiments, the layer 107(a) can be a layer of semiconductor doped to produce the current carriers opposite in charge to those in the nanowire itself. For example, if the nanowire is doped p-type, then the layer 107(a) may be an n-type doped layer and vice versa. This will be clear to those familiar with the basics of the field effect transistors which normally require that a depletion layer is formed along the conducting channel in the vicinity of the gate region. Again in some other embodiments, the layer 107(a) could be a complex layer consisting of two sub-layers, of which the lower layer is designed to form the depletion layer and is composed of doped semiconductor and the upper layer isolates the gate 107 from the depletion layer (dielectric). These are again very basic elements known to those skilled in the transistor design. In some other embodiments, the depletion layer is formed by doping the material underneath the nanowire, e.g. by doping the subsurface layer of the substrate 100. It should be stressed that the size of the areas 105, 106, 107 relative to the size of the nanowire can vary. For example, it is possible to construct embodiments where the separation between the three regions is much smaller than the size of the drain, gate and source regions themselves. It is even possible to have embodiments where the three regions partially overlap. In this case additional dielectric layers need to be added to avoid direct electric contact between the three regions. In some embodiments, the regions 105, 106, 107 could spread well beyond the size of the nanowire to cover other areas of the substrate.

Figure 13:
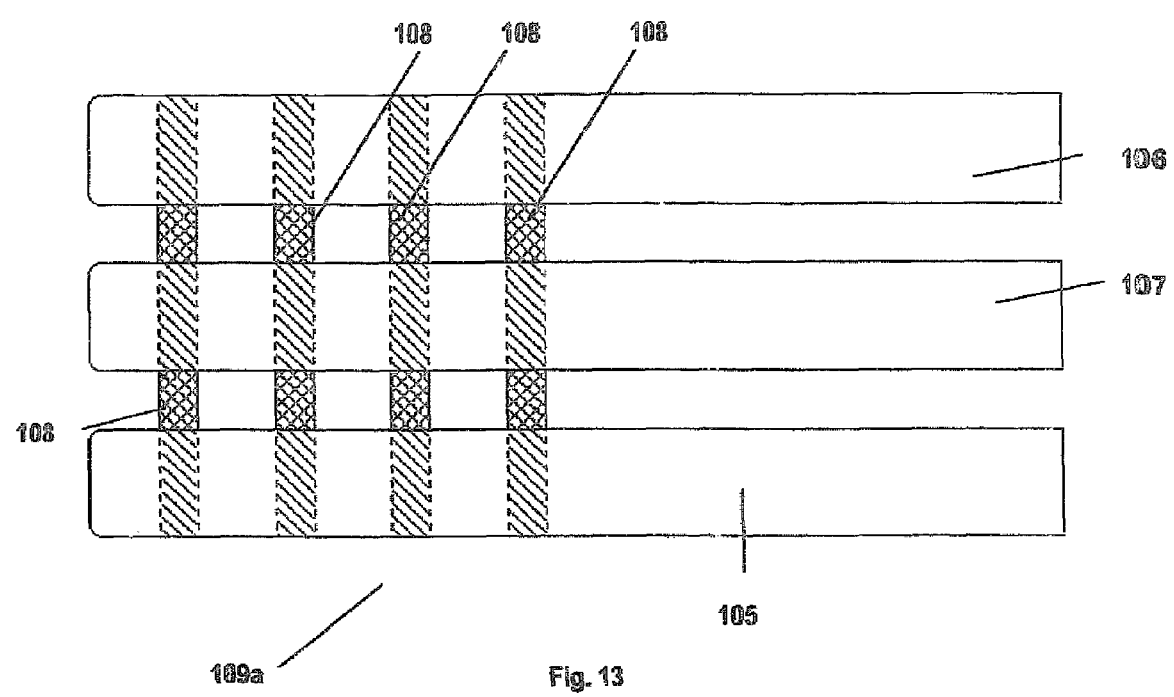
FIG. 13 shows another embodiment of the transistor device that is based on the nanowires formed according to the invention.

The nanowire transistor can also comprise a number of nanowires as shown in FIG. 13 which illustrates a transistor 109a with the rest of the parts identified by the same reference numerals as in FIG. 12. FIG. 12 shows the top view of the transistor and therefore the layer 107a is not shown as it be positioned just under the layer 107. The area 107 may also spread beyond the area 107 at it will be appreciated by those skilled in the art. The operation of the transistor will be very clear to those familiar with field effect transistors and therefore does not require further description. Again FIG. 13 does not show any atomic steps or atomic terraces for simplicity.

In the embodiments described above, the dopant nanowires were formed from dopant material deposited on the substrate. For certain materials it may be possible to create the fractional layer of the dopant material by its segregation from the substrate. Typically this is achieved by annealing the material in vacuum or under controlled atmosphere. Reference is made to the description of the segregation of Ca and K impurities from the bulk of a single crystal of magnetite $Fe_3O_4$ by some of the present inventors [G. Mariotto, S. F. Ceballos, S. Murphy, N. Berdunov, C. Seoighe, I. V. Shvets, Phys. Review B 70 Art No 035417 (2004)]. We have found that in the example of this particular system a significant fraction of a monolayer can segregate at the surface after 20-100 hours of anneal time in ultra high vacuum chamber. Clearly, the anneal temperature, anneal time and requirements for the atmosphere in the chamber during the anneal depend on the type of material of the substrate and the type of impurity that segregates from the bulk on the surface.

Figure 14:
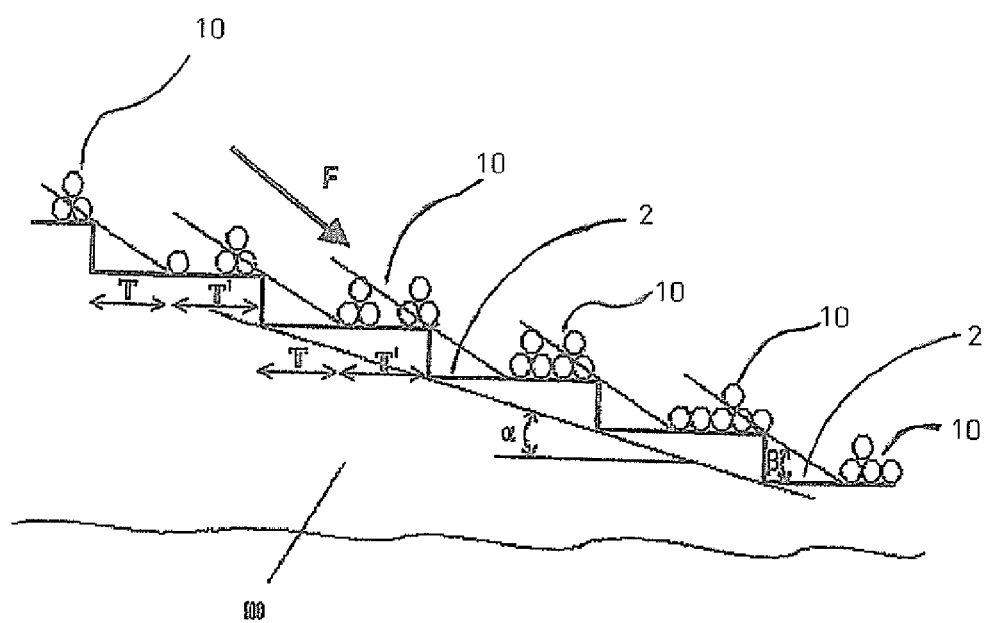
FIG. 14 is a cross sectional view demonstrating the process of formation of nanowires at the outer edges of the terrace steps.

Referring to FIG. 14, a method of forming the dopant nanostripes 10 is described with the same reference numeral used as before, where appropriate. The reason why such a method may be required is that for some substrate materials and some dopant materials it may be difficult or impossible to achieve the conventional step flow growth mode. For example, the dopant material may simply not grow in this mode or alternatively the temperature of the substrate required to sustain the step flow growth mode may be too high resulting in unacceptably high diffusion of the dopant material into the bulk of the substrate leading to smearing of the nanowires. The substrate 100 has a miscut angle $\alpha$ with respect to the low index surface. The dopant nanostripes 10 are deposited by directing a flux on the surface 1 at a shallow angle $\beta$ that is of the magnitude broadly comparable to the angle $\alpha$. In the contest of FIG. 14, the flux of the dopant atoms is directed rightwards and downwards as shown by the arrow F. In FIG. 14 the angle $\alpha$ is somewhat greater than the angle $\beta$, for example $\beta=2\alpha$. Other ratios between the angles $\alpha$ and $\beta$ are also possible. The substrate is kept at a temperature low enough to suppress the diffusion of the impurities or adatoms 10(a) of the fractional layer forming the dopant nanostripes 10. In this case the adatoms 10(a) of the layer forming the dopant nanostripes 10 will preferentially nucleate in the vicinity of the outer edge (right edge) of each atomic terrace 2 as the areas of the terrace 2 in the vicinity of the inner edges are shadowed from the flux by the atomic steps 3. If the temperature of the substrate 1 is low, this layer is likely to grow as a non-epitaxial layer as shown schematically in FIG. 14 by irregular positions of the spheres representing the atoms 10(a) of layer forming the dopant nanostripes 10. However, as we explained above, epitaxial growth of the dopant nanostripes 10 is not essential for the invention. In this way each atomic terrace 2 is subdivided into two regions: one on the left in the vicinity of the inner terrace edge called T and the other one on the right in the vicinity of the outer terrace edge called T', that are respectively not covered and covered by the fractional layer forming the dopant nanostripes 10. The regions T and T' form, in effect nanostripes that are positioned along the terrace edges.

The ratio between the widths of the areas T and T' is given by the angles α and β. This is the matter of simple geometrical calculation and therefore is not included in the specification.

Figure 15:
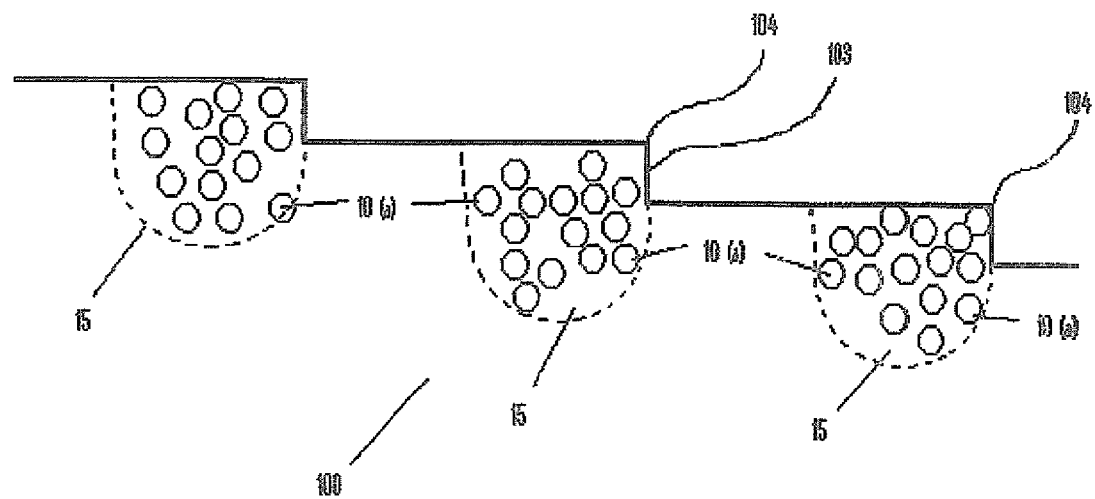
FIG. 15 is a schematic view of the nanowires formed according to the invention.

The above description explained in detail how to prepare an array of dopant nanostripes. Then they have to be converted to nanowires 15. In one such embodiment, the substrate with the dopant nanostripes thus formed is annealed. This leads to the diffusion of the dopant atoms 10(a) thus forming the nanowires 15 positioned in the vicinity of the outer edges of the atomic terraces 2 as shown in FIG. 15. Then the optional layers can be deposited on top of the array of the nanowires if required. In another embodiment etching of the substrate containing the nanowires can be performed in which etch rate is different in the doped and undoped regions of the semiconductor. This leads to exposure of the nanowires similar to the embodiment presented in FIG. 11.

According to another embodiment, again referring to FIG. 14, the over layer as described above is deposited on top of the bare substrate and on top of the fractional layer forming the dopant nanostripes 10, e.g. by deposition in the direction normal to the substrate or at a non-shallow angle. It may also be possible to deposit the over layer at a shallow angle β' that is equal to β or different from it. Following the deposition of the over layer the structure is annealed forming the nanowires resulting from the diffusion of the atoms of dopant nanostripes into the substrate 100 and into the over layer 11 as described above. It will be noted that the over layer 11 is not illustrated in FIG. 14. The anneal temperature and the anneal time are optimised experimentally. To optimise the anneal time and the anneal temperature it may be required to perform the measurements by means of high-resolution transmission electron microscope (TEM). TEM can create contrast based on difference in the level of doping and therefore the nanowires can be visualised even if they are embedded in the semiconductor material, provided that the difference in the level of doping is high enough.

It should be pointed that the terrace step between the neighbouring atomic terraces can be greater than one atomic step. This is known as double step or multiple step. This is particularly the case for substrates that show step bunching. As a results, it should be pointed that in the embodiments above, an in particular the embodiments of FIG. 14, the thickness of the layer forming dopant nanostripes 10 could be greater than one atomic layer.

Figure 16:
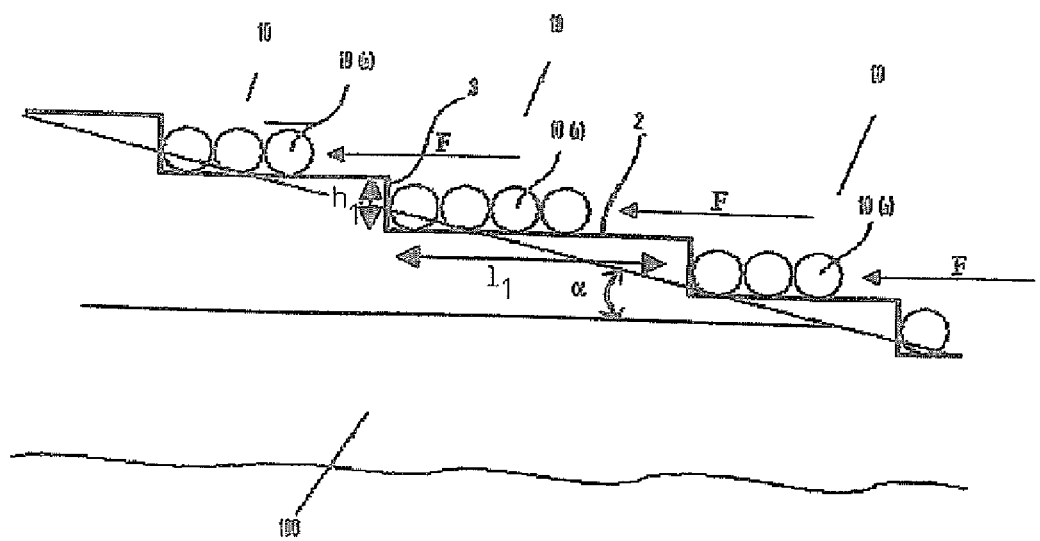
FIG. 16 is a cross sectional view demonstrating the process of formation of nanowires at the inner edges of the terrace steps.

FIG. 16 shows another embodiment in which a fractional layer used to form the dopant nanostripes 10 is deposited at the inner edge of terrace steps 3. Again, parts similar to those described with reference to the previous drawings are identified by the same reference numerals. In this case the flux of the atoms of this fractional layer is directed at the substrate nearly parallel to the atomic terraces, at a shallow angle. It is essential that in this embodiment the flux is directed towards the direction of the ascending terraces. The direction of the flux is shown in FIG. 16 schematically by the arrow F and in the contest of the miscut direction presented in FIG. 16, the beam is directed leftwards. The meaning of the words "flux directed nearly parallel to atomic terraces" implies that the flux is well collimated and the angle of the flux with respect to the atomic terraces is at least not significantly greater than the miscut angle α. It could be smaller than α but it could also be a relatively small multiple (a factor of 3 to 10) of α in particular when the miscut angle α is small (e.g. α is up to 10 degrees). In the context of a situation such as illustrated in FIG. 16, the growth will occur mainly along the left edge of the of terraces 2 (along the inner steps 2) if the area of atomic terrace 3 exposed to the flux is much smaller than the area of atomic step 3 between the terraces exposed to the flux. If the flux is directed at an angle β with respect to atomic terraces 2 and the width of atomic terrace is $I_1$, then the unit length of the atomic terrace has the area $S_{ter}$ exposed to the flux equal to $S_{ter}=I_1*\sin β$. Yet if the height of the steps between atomic terraces is $h_1$, then the unit length of the area of the steps between atomic terraces $S_{step}$ has the area $S_{step}=h_1*\cos β$ exposed to the beam. The condition at which the growth mainly occurs at the inner step is then $I_1*\sin β << h_1*\cos β$ Thus to grow the fractional layer according to the embodiments referred to in FIGS. 14 and 16, the flux of the material to form the fractional layer should arrive at the substrate 1 at a shallow angle, nearly parallel to the atomic terraces of the surface. For example, if the substrate miscut angle is 2 degrees, then the angle β should be in the range of some 0.1 to 10 degrees. Again, these values of the angle are given here merely as examples. In practice the value of the angle β should be optimised once the specific requirements for the dopant nanostripes are given. To direct the flux at such a shallow angle on the substrate, it may be convenient to use a source located at a significant distance away from the substrate, e.g. at the distance of some 0.5 to 5 meters. These values are given here as examples and values outside this range are also possible.

It is also possible to construct embodiment whereby the nanowires with different type of doping are deposited at inner and outer steps. For example, in the contest of FIG. 16 one may first deposit the p-type dopant material with the flux directed leftwards at shallow angle $β^1$ with respect to the surface. Then the n-type dopant material is deposited with the flux directed rightwards at shallow angle $β_2$ with respect to the surface. Then the over layer 11 is deposited. In this way at each inner step of atomic terraces p-type nanowire is formed and at each outer step of atomic terraces n-type nanowire is formed after the annealing. Similarly one could form the nanowires with the same type of doping but different concentration of the dopant atoms at inner and outer steps of atomic terraces.

Figure 17:
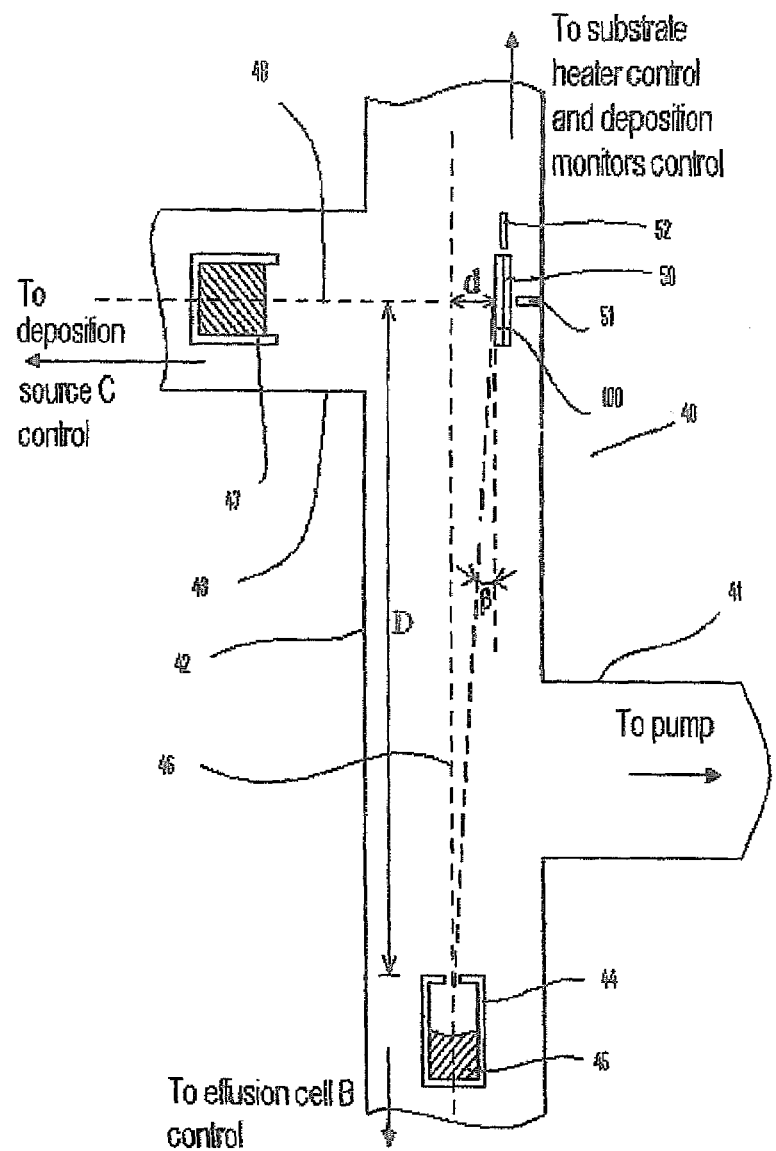
FIG. 17 is a diagrammatic representation of one of the devices for forming nanowires according to the invention.

Referring to FIG. 17, there is shown schematically a device, indicated generally by the reference numeral 40, for forming a nanowire array according to the invention. The device 40 is connected to a vacuum pump (not shown) through an outlet 41 and forms two growth chambers: namely a first chamber 42 and a second chamber 43. The first growth chamber 42 mounts an effusion cell 44 containing evaporant material 45, the evaporant material 45 being used to provide the dopant nanostripes. A substrate mounting device 50 is provided in the position that is common for the growth chamber 42 and growth chamber 43. The substrate mounting device 50 is oriented so that the substrate 100 is positioned in such a way that the atomic terraces 2 are parallel or almost parallel to the axis of the growth chamber 42, identified by the reference numeral 46 and shown by one of the interrupted lines. The axis of the effusion cell coincides with the axis of the chamber 42. The substrate 100 is displaced from the axis of the effusion cell 42 by a distance d and located at a linear separation D from the cell 44.

A deposition source 47 is located in the growth chamber 43 having an axis, identified by the reference numeral 48 and shown by interrupted lines. The deposition source 47 could be any source suitable for the deposition of the film, e.g. magnetron, Knudsen cell, electron beam evaporator, etc. The flux of the material to form the film can arrive to the substrate 100 that is mounted on the mounting device 50 along a direction nearly normal to the surface of the substrate 100.

In one embodiment, the rear of the substrate 100 is provided without any miscut and the rear of the substrate is aligned parallel to the axis 46 of the growth chamber 42. In this case the two surfaces of the substrate, namely the front and rear are not parallel to each other. The front of the substrate 100 is miscut with respect to a low index plane and the rear is cut along the low index plane. The distance d, as can be seen in FIG. 17, is much smaller than the separation D between the effusion cell 44 containing the evaporant 45 and the substrate 10 mounted in the mounting device 50. The effusion cell can be a Knudsen cell, thermal cell, electron gun heated cell, magnetron or other cell suitable for vacuum deposition of the material to form the nanowires 15.

If the distance d is much smaller than the distance D, then the angle $\beta$ in units of radian is equal to d/D. Thus by controlling the off-axis displacement d of the substrate 100, one can set the desired value of the angle $\beta$. If the two surfaces of the substrate, the front and the rear, are parallel to each other, i.e. both surfaces are miscut from a low index plane in the same way, and if the rear surface of the substrate is still aligned parallel to the axis of the growth of the chamber 46, then a simple correction is required to the above formula $\beta=d/D$. Again, it is not necessary to deal with the details of this correction, as this is a matter of basic geometry.

Further there are provided deposition monitors 51 and 52, measuring and controlling the flux from the effusion cell 44 and deposition source 47 respectively. The deposition monitor 51 is aligned to detect the flux of the evaporant material 45 forming dopant nanostripes along the axis 46 of the growth chamber 42. The deposition monitor 52 is aligned to detect the flux of the material used to form the over layer film along the axis 48 of the growth chamber 43. It should be noticed that as the deposition monitor 51 is not parallel to the surface of the substrate 100, but nearly perpendicular to the substrate surface (so that it detects flux in the direction almost parallel to the surface of the substrate 100), the coverage of the material to form the dopant nanostripes is not equal to the coverage detected by the deposition monitor 51. Thus, it needs to be multiplied by $\sin \beta$. Again this does not require any further description to those skilled in the art. The chamber 43 is also equipped with pumps, controllers and various other monitors that are not shown in detail. The array of nanowires 15 is grown by first depositing the required amount of the material to provide the dopant nanostripes by using the effusion cell 44 and the deposition monitor 51. Then the over layer is deposited by using the deposition source 47 and the deposition monitor 52.

It is also possible to construct an embodiment whereby the nanowires are deposited in one step from a doped semiconductor material. The flux of the doped semiconductor material should then be directed at a shallow angle with respect to the vicinal surface. This embodiment could be constructed using a set up similar to the one in FIG. 17. In this case the effusion cell 44 should contain the doped semiconductor. In order to ensure that the dopant and the semiconductor material from the source 44 are deposited at the same rate (e.g. to avoid preferential deposition of the dopant first followed by deposited on undoped semiconductor) it may be required to use a source that deposits the material from the solid target such as e.g. magnetron. This will be known to those skilled in the art of vacuum deposition of semiconductor materials and is based on the fact that two materials deposited from a single moult must have similar values of vapour pressure. Otherwise, the deposition rates of the two materials will be different. The deposited nanowires of doped semiconductor may still need to be subjected to a short anneal. Such anneal may be required to reconstruct the material in the nanowires to form an epitaxial structure.

Alternatively, to form an array of nanowires according to the invention one could utilize an instrument substantially similar to the one shown in FIG. 17 that is different in one significant aspect: instead of the effusion cell 44 it comprises a well-collimated ion gun which is the source of energetic ions, e.g. source of Ar, Ga or O ions. The ions from the gun are directed to the surface of a substrate 100 at a shallow angle forming the ion beam. To control the angle of the ion beam, the sample position could be selected as described above in relation to FIG. 17. In addition to that one could use a further method of control utilizing the fact that ions are charged particles and their movement direction can be altered by means of an external electrostatic field. Thus to control the direction of the ion beam, an electrostatic field substantially perpendicular to the axis of the chamber 42 is formed. This can be done using techniques well known to those skilled in the art of ion sources. Using this instrument one could form the array of nanowires as follows. The ions in the ion source could be used to form the dopant nanostripes as described above in previous embodiment. This may not be suitable for all the ion sources, but only for some combinations of the substrates and ions. For example, this could be achieved for Ga ions but may be difficult to achieve for Ar ions. After that the over layer is deposited as described above and the multilayer structure thus deposited on the substrate is subjected to anneal as explained in detail above. Alternatively, the method could be as follows. Firstly the substrate is covered by a thin layer of dopant. For this the entire substrate could be covered at a non-glancing angle. Following this, the substrate could be subjected to ion etching at a shallow angle thus removing the fractions of the thin layer of dopant from some parts of the atomic terraces. For example, this could be done with etching by Ar ions removing the dopant material from those parts of the atomic terraces that are exposed to the Ar ion beam. In this way the dopant nanostripes are formed either at the inner or at the outer step edges of atomic terraces depending on the direction of the ion beam. Then the over layer is deposited and the multilayer structure is subjected to anneal as described earlier. It is also clear that the method could be a combination of the two above approaches. For example, the thin layer of dopant could also be deposited at a shallow angle thus forming nanostripes of a particular width determined by the angle $\beta_1$ of deposition of dopant atoms. Then the substrate could be etched by directing the beam of ions at an angle $\beta_2$ that could be equal to $\beta_1$ or different from it.

In another embodiment of the method, the material deposited at a glancing angle as described above is not the material of the dopant elements only, but the material of the semiconductor. For example, the substrate could be the surface of vicinal insulating material $SrTiO_3$. Then the nanowires of Si could be formed on the semiconductor material at the outer steps of atomic terraces as described above. Alternatively the substrate could be e.g. surface of an n-type Si(111). Then doped Si containing p-type impurities could be deposited at a glancing angle forming p-type nanowires e.g. from the target of doped Si. Numerous other combinations will be now obvious to those skilled in the art.

Figure 18:
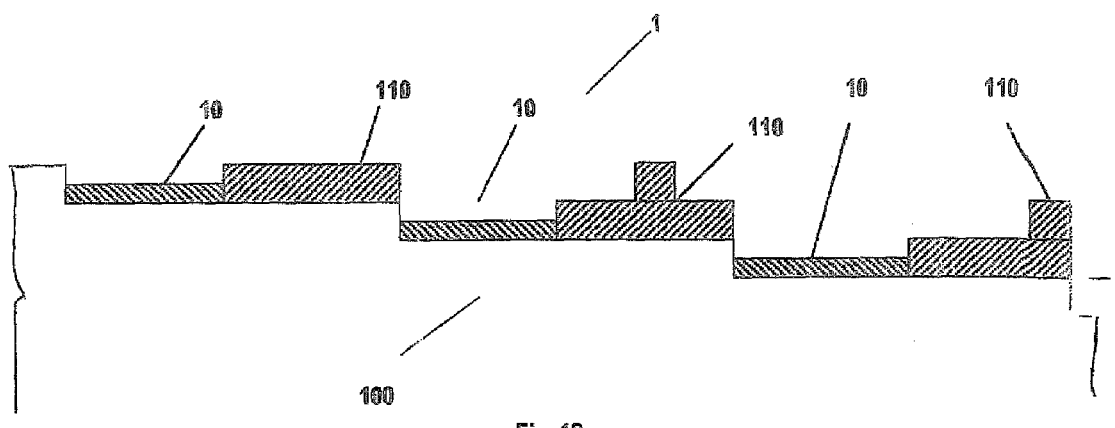
FIG. 18 is a diagrammatic representation of another embodiment of the nanowire array.

Referring now to FIG. 18, there is illustrated an alternative embodiment of the invention in which parts similar to those described with reference to the previous drawings are identified by the same reference numerals. In this embodiment, firstly spacer nanostripes 110 are formed on the edges of a vicinal insulating surface 1. These could be formed e.g. by glancing angle deposition at the outer edges of atomic terraces as shown in FIG. 14. Alternatively they could be formed at the inner edges of atomic terraces, e.g. by step flow growth. Preferably these spacer nanostripes are of material with low surface energy. In this way, there is formed a surface of a material containing the nanoscale areas with low surface energy positioned along the step edges of atomic terraces. When such a surface is covered by adatoms, those skilled in the art will appreciate that the areas with high surface energy will get covered earlier than the areas with low surface energy. In other words, the adatoms will preferentially nucleate at the areas with high surface energy rather than at the areas with low surface energy. This is because of the energy considerations: once the areas with greater surface energy are covered by the film, this results in greater overall energy reduction in the system. Therefore, if such a substrate is then covered by a fractional layer of dopant nanostripes 10, the adatoms 10(a) will preferentially cluster in the areas of the bare substrate surface 1 rather than on top of the spacer nanostripes 110. In this way the dopant nanostripes 10 could be formed either along the inner or along the outer edges of atomic terraces 2 of the surface 1. Then the over layer could be deposited on the surface as described above. The dopant nanostripes 10 positioned in between the spacer nanostripes 110 could be of material that can form conducting paths itself (e.g. metal atoms). In this way the dopant nanostripes 10 form the nanowires themselves. This is similar to one of the embodiments described above.

Alternatively in another embodiment, the dopant nanostripes 110 could be of doped semiconductor material. In this way the semiconductor nanowires are formed on the surface directly without the need for the over layer and subsequent anneal. This is again similar to one of the embodiments described above.

Figure 19:
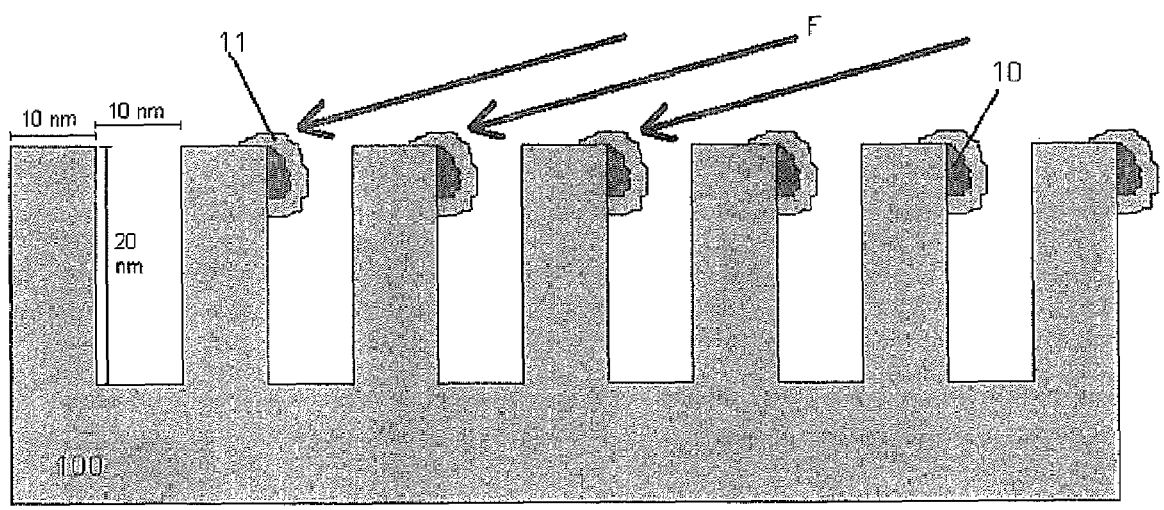
FIG. 19 is a diagrammatic representation of another embodiment of the nanowire array.

Referring now to FIG. 19, there is shown a diagrammatic representation of the formation of nanowires on a square wave substrate 100. It is important to note that according to this aspect of the invention, the walls do not have to be vertical but could be tilted with respect to the direction orthogonal to the surface of the substrate. The walls could be of any regular topological profile wherein deposition at a shallow angle according to the invention achieves partial shadowing of the material at some areas of the substrate. As shown in FIG. 19 in this embodiment of the invention, the nanowires are formed on the vertical walls of a square wave shaped substrate. The substrate could be formed by, for example, preferential etching and lithographic process. The methods of forming of such a topographic profile will be readily known to those skilled in the art of semiconductor microfabrication. Ideally, the walls of the square wave shaped substrate are approximately 5 nm to 10 nm wide and approximately 1 nm to 30 nm high, with an ideal separation of approximately 5 nm to 30 nm. Preferably, the walls are approximately 10 nm wide and approximately 20 nm high, with an ideal separation of approximately 10 nm. The nanowires formation process is as follows, the dopant material (10), for example P or B, is deposited at a shallow angle with respect to the overall substrate surface (incident flux angle F) and is thereby only incident on a portion of the substrate due to the shadowing effect of the neighbouring walls. The substrate could be of insulating or semiconductor material e.g. Si, Ge, Si—Ge alloy, silicon on insulator (SOI). The over layer material (11) is subsequently deposited at a similar angle to the dopant layer and as such is deposited on top of the dopant layer. It should be noticed that the over layer could also be deposited at a different angle to the one of the dopant material. Preferably, the fluxes of the dopant material and the over layer are well collimated. This pins the dopant layer between the substrate and the over layer. The dopant layer/over layer (multilayer) system is then thermally treated in a manner similar to other embodiments. Upon thermal treatment and due to the pinning effect of the over layer and substrate, the dopant material diffuses into both the over layer and the substrate resulting in a doped nanowire. The undoped material may be removed by preferential etching to leave exposed semiconducting nanowires. The system may be left as is and the over layer may be used to generate strain in the nanowire thus effecting the carrier mobility by enhancing the mobility.

The nanowires according to the embodiment described in FIG. 19 could then be utilised for making the transistor devices described previously.

It should be stressed that most of the methods described in the earlier part of the specification in relation to the FIGS. 7-11 could also be applied in this case. For example, these could include deposition of the doped semiconductor material at a shallow angle instead of the two-step deposition of the dopant material followed by the deposition of the over layer. This could also include choosing the materials of the substrate, the dopant material and the over layer in such a way that strain is created in the doped nanowires. This could also include deposition of the dopant material at a shallow angle without the over layer so that the nanowires are formed in the substrate by the diffusion of the dopant material into the substrate. This could also include deposition of the dopant material and then subjecting the substrate to energised ion beam or chemically reactive species directed at a shallow angle with respect to the surface to remove the dopant material from some areas of the substrate while leaving it at the others. We will not mention other variations of the method discussed above to avoid duplication.

It is envisaged that the device utilising the nanowire transistors will typically comprise massive arrays of such transistors accommodated on the area of up to some few centimetres square or even greater. The typical size of a modern processor or memory chip is in this range. Given that the separation between the nanowires is in the nanometre range, it is clear that the total number of nanowires on a chip could amount to many millions and possibly many billions. These arrays could be used e.g. for making processors and memory chips. In this light it will be useful to briefly outline how these arrays of nanowires could be utilised for such applications.

The array of transistors can be established in numerous ways as will be clear to those skilled in the art of computer processor and memory chip design. Typically the architecture of a modern processor or memory chip implies a multilayer layout. The modern processors utilising 65 nm technology employ up to 8-10 layers. Essentially, just one layer of these 8-10 layers is a functional Si layer containing transistors whereas most other layers contain metallization interconnects and auxiliary elements. This complex three-dimensional layout is employed to reduce the heat loss and enhance the speed of the processor or memory chip. Typically the thickness of metallization and the size of the features in the upper layers are greater than these in the lower ones. For a typical architecture of a microprocessor one could look at the publication [S. Thompson, M. Alavi, M. Hussein, P. Jacob, C. Kenyon, P. Moon, M. Prince, S. Sivakumar, S. Tyagi, M. Bohr, "130 nm Logic technology featuring 60 nm transistors, low-K dielectrics and Cu interconnects", Intel Technology Journal vol 6 issue 2, pages 5-12] which is incorporated in the specification as background information. The invention envisages that the array of nanowires may be used in a similar fashion: one layer contains all the field effect transistors based on the nanowires and the all the interconnects are arranged in other layers deposited on top of the nanowire array. The functional layer containing the nanowires may need to be segmented into segments assigned to individual transistors leaving some gaps in between the segments in which the nanowires are removed. Alternatively, nanowires in between the segments could be doped in such a way that they are no longer conducting. For example, the substrate could be segmented into the areas with the lateral dimensions of some 10-50 nm by 10-50 nm so that the lateral size of a single transistor is e.g. 50 nm by 50 nm. It is envisaged that in order to enhance the yield of the technology it may be beneficial to include a number of nanowires into a single transistor. For example, a single transistor could contain 2 or 5 or 20 nanowires running substantially along the same direction. In this way if one of the nanowires is missing at the segment allocated to the transistor, this may not have catastrophic effect such as a dysfunctional transistor that would occur otherwise. It is further envisaged that in a typical transistor according to the invention, the length of the nanowire will not be too long. For example, even if the technology allows producing nanowires that are many micrometres long, the practical length of the nanowires in a single transistor could be less than 100 nm. Therefore, one long nanowire may need to be cut into segments along its length to make a number of independent transistors. In this way the surface covered by the nanowires should be considered as medium that needs to be segmented for further processing. Again it should be stressed that the term "cut nanowire" does not necessarily mean that the nanowire is cut physically into segments. If could mean that the nanowire is doped by subsequent lithography process in such a way that it contains conducting and nonconducting segments along its length. Clearly making such a processor would require numerous lithography steps on a substrate containing nanowires. It is also possible to alter the manufacturing process in such a way that the segmentation of the surface into areas for individual transistors is done before the formation of the nanowires. In this way the nanowires formed in various segments will be electrically insulated from each other right from the moment of their formation.

It should be further stressed that there is a massive variety of transistor types and even types of field effect transistors. These include n-MOS (NMOS) n-type Metal Oxide Semiconductor Field Effect Transistor, p-MOS (PMOS) p-type Metal Oxide Semiconductor Field Effect Transistor, CMOS—Complementary Metal Oxide Semiconductor Field Effect Transistor, and other types of field effect transistor. CMOS technology utilises pairs of transistors working in tandem to reduce the energy consumption of transistor-based logic and to enhance its speed. These technologies are well known to those skilled in the art of electronics and transistor design. For example, CMOS is known since 1960s. The credit for its invention is often ascribed to F. Wanlass and Fairchild Semiconductors. There are also numerous recent technological improvements routinely used for the transistor design. For example, low K dielectrics are used in the gate dielectric layer. The gate metal electrode that gave the name MOS is in fact routinely not made of metal any longer but e.g. of polycrystalline Si. Yet, the old abbreviation MOS originating from the time when gate electrode was typically made of metal Al, is still commonly used. We will not expand on this aspect as it can be found in numerous texts. An introductory text by J. J. Sparkes, "Semiconductor Devices", Chapman and Hall 1994 is incorporated in the specification as part of the background information.

We should also stress that although the examples of electronic devices are based on field effect transistor, other device types could be used. For example, one could also use the nanowire as the body of the bipolar transistor so that the two ends of the nanowire become emitter and collector and its middle part contains the base. In this case the type of doping along the nanowire needs to be modified along its length with the help of lithography.

In the specification the terms "comprise, comprises, comprised and comprising" or any variation thereof and the terms "include, includes, included and including" or any variation thereof are considered to be totally interchangeable and they should all be afforded the widest possible interpretation and vice versa.

The invention is not limited to the embodiment hereinbefore described, but may be varied in both construction and detail.

The invention claimed is:

1. A method of preparing an array of conducting or semiconducting nanowires comprising:
   forming a vicinal surface of stepped atomic terraces on a substrate; and
   depositing a fractional layer of dopant material to form nanostripes having a width less than the width of the atomic terraces;
   wherein diffusion of the atoms of the dopant nanostripes into the substrate forms the nanowires.

2. The method according to claim 1 wherein the dopant material is either one of As, Sb, In, Ga, Al, B and P, or a doped semiconductor material chosen from Si, Ge or Silicon-Germanium alloy doped with one of As, Sb, In, Ga, Al, B and P.

3. A method of preparing an array of conducting or semiconducting nanowires:
   forming a vicinal surface of stepped atomic terraces on a substrate;
   depositing a fractional layer of dopant material to form nanostripes having a width less than the width of the atomic terraces;
   covering the nanostripes with an over layer to form a multilayer structure; and
   optionally annealing the multilayer structure;
   wherein diffusion of the atoms of the dopant nanostripes into one or both of the substrate and over layer forms the nanowires.

4. The method according to claim 1 wherein the atoms of the dopant nanostripes are aligned to form an epitaxial layer.

5. The method according to claim 1 wherein the dopant nanostripes are formed in co-ordination with the step edges of the atomic terraces.

6. The method according to any claim 1, further comprising annealing immediately after depositing.

7. The method according to claim 1 wherein the flux of the atoms forming the fractional layer of dopant material is collimated and the dopant nanostripes are formed by shallow angle deposition of the collimated flux.

8. The method according to claim 7 wherein shallow angle deposition occurs at an angle substantially the same as the miscut angle of the substrate from a low index surface.

9. The method according to claim 7 wherein the flux of the atoms forming the fractional layer of dopant material is directed substantially along the miscut azimuth direction along the ascending step direction.

10. The method according to claim 7 wherein the flux of the atoms forming the fractional layer of dopant material is directed substantially along the miscut azimuth direction along the ascending step direction.

11. The method according to claim 1 wherein the atomic terraces of the substrate are partially shadowed from the flux by the atomic steps to result in non-uniform coverage of the dopant material at different areas of the atomic terraces.

12. The method according to claim 1 wherein the width of the dopant nanowires is determined by controlling the angle of the collimated flux of atoms forming the fractional layer of dopant material with respect to the atomic terraces of the substrate.

13. The method according to claim 1 wherein the dopant nanostripes, having a width less than the width of the atomic terraces, are formed by depositing a layer of dopant material over the vicinal surface of the substrate, and exposing the vicinal surface with dopant material to energized ion beam etching of the dopant material, wherein the energized ion beam is collimated and directed at a shallow angle with respect to the surface.

14. The method according to claim 1 wherein the dopant nanostripes, a width less than the width of the atomic terraces, are formed by depositing a layer of dopant material over the vicinal surface of the substrate, and exposing the vicinal surface with dopant material to a collimated beam of chemically reactive species which reacts with the dopant material and etches the dopant material away, wherein the collimated beam of chemically reactive species is directed at a shallow angle with respect to the surface.

15. The method according to 13 wherein the collimated energized ion beam or collimated beam of chemically reactive species is directed at an angle that is substantially the same as the miscut angle of the terraces of the substrate.

16. The method according to claim 15 wherein the shallow angle of the collimated energized ion beam or collimated beam of chemically reactive species differs to the shallow angle of the collimated flux of atoms forming the fractional layer of the dopant material.

17. The method according to claim 13 wherein the width of the nanowires is determined by controlling the angle of the collimated energized ion beam or collimated beam of chemically reactive species with respect to the atomic teffaces of the substrate.

18. The method according to claim 1 wherein a fractional layer of doped semiconductor is formed on the vicinal surface of the substrate.

19. The method according to claim 18, further comprising depositing a collimated flux of doped semiconductor material on the vicinal substrate at a shallow angle wherein part of atomic terrace is shielded from the flux of the doped semiconductor and other areas are exposed to the flux of the doped semiconductor, to form an array of nanowires correlated with the atomic steps of the vicinal substrate.

20. The method according to claim 1 wherein the vicinal substrate comprises a semiconductor, an insulating material, Si, Ge, Silicon-germanium alloy, Silicon on Insulator (SOI), MgO, $SrTiO_3$, $MgAl_2O_4$ or $Al_2O_3$.

21. The method according to claim 1 wherein the vicinal substrate is formed by heat treatment of the miscut substrate which has been subjected to lithography structuring, or by an electric field during heat treatment to facilitate the formation of atomic terraces.

22. The method according to any of the preceding claim 1 wherein spacer nanostripes are deposited on part of the atomic terraces prior to depositing, whereby the fractional layer of dopant material is deposited on a part of the atomic terraces not covered by the spacer nanostripes.

23. The method according to claim 22 wherein the spacer nanostripes comprise a fractional layer of material of low surface energy.

24. The method according to claim 1 wherein the nanostripes are located at the inner steps and/or the outer steps of the atomic terraces.

25. The method according to claim 1 wherein the width and breadth of the nanowires are of substantially the same cross-sectional dimensions.

26. The method according to claim 3 wherein the overlayer comprises an insulation material, a semiconductor material, a layer of Si, Ge, or a SiGe alloy.

27. The method according to claim 3 wherein the over layer and substrate have different diffusion coefficients whereby diffusion of the material from dopant nanostripe is substantially or totally into either the substrate or over layer which has the greater diffusion coefficient.

28. The method according to claim 3 wherein the vicinal substrate is a semiconductor material or an insulation material, the over layer is an insulation material or a semiconductor material and wherein the substrate and over layer are different.

29. The method according to claim 1 further comprising exposing the nanowires, optionally by preferential etching.

30. The method of preparing an array of conducting or semi-conducting nanowires according to claim 1 wherein pairs of conversely doped dopant nanostripes are formed wherein depositing comprises:
   i. collimating a first flux of atoms forming the fractional layer of the first dopant material and directing the first flux at a shallow angle with respect to the atomic terraces to form dopant nanostripes of the first material at the inner edges of the atomic steps; and
   ii. collimating a second flux of atoms forming the fractional layer of the second dopant material and directing the second flux at a shallow angle with respect to the atomic terraces to form dopant nanostripes of the second material at the outer edges of the atomic steps.

31. The method according to claim 30 wherein the shallow angle of the first and second flux have different azimuth directions.

32. The method according to claim 30 wherein the first flux of the first dopant material is deposited along the rising direction of the atomic steps and the second flux of atoms is deposited along the descending direction of the atomic steps.

33. The method according to claim 30 wherein the shallow angle is an angle that is substantially the same as the miscut angle of the substrate.

34. The method according to claim 30 wherein the first and second dopant materials are the same or different materials.

35. The method according to claim 34 wherein the nanostripes formed at the inner and outer edges have different amounts of dopant material.

36. The method according to claim 30, wherein the first and second dopant materials comprise doped semiconductor materials.

37. A method of making a field effect transistor device with a gate, a drain, source, and a channel between the drain and the source comprising one or more nanowires made in accordance with claim 1 wherein the transistor has a dielectric layer separating the gate from the channel, and the method comprises:
   a. forming a dielectric layer, preferably a layer of oxide or nitride, on the nanowire channel; and
   b. forming the gate over the dielectric layer.

38. A method of making a complementary pair of transistors, namely a p-type and n-type transistor, comprising preparing nanowires in accordance with claim 1 wherein conversely doped dopant nanostripes are formed and wherein depositing comprises:
   a) collimating a first flux of atoms forming the fractional layer of the first dopant material and directing the first flux at a shallow angle with respect to the atomic terraces to form dopant nanostripes of the first material at the inner edge of the atomic steps; and b) directing a second collimated flux of atoms forming the fractional layer of the second dopant material at a shallow angle with respect to the atomic terraces to form dopant nanostripes of the second material at the outer edges of the atomic steps.

39. A method of preparing an array of conducting or semiconducting nanowires comprising the steps of:

forming a regular topographic pattern on a substrate by means of lithography, wherein the topographic pattern is an array of walls, a wave shaped topography, or other regular topographic pattern;

depositing a collimated beam of dopant material at a shallow angle with respect to the substrate surface to form a fractional layer of dopant material positioned in correlation with the topographic pattern to form nanostripes;

covering the nanostripes with an over layer to form a multilayer structure; and optionally annealing the multilayer structure to cause diffusion of atoms of the dopant nanostripes into one or both of the substrate and over layer to form nanowires and/or forming epitaxial material in the nanowires.

40. The method according to claim 39 wherein the dopant material is selected from As, Sb, In, Ga, Al, P or B.

41. The method according to claim 39 wherein the dopant material is deposited at a shallow angle on a portion the vertical walls, wave shaped substrate or substrate containing an alternative topographic pattern.

42. The method according to claim 39 wherein the over layer is deposited at an identical or substantially similar angle to the deposition angle of the dopant layer to result in a multilayer substrate wherein the dopant layer is interposed between the substrate and the over layer.

43. The method according to claim 39 wherein the multilayer structure is subjected to an annealing step.

44. The method according to claim 39 wherein the nanowires are exposed by preferential etching to remove any undoped material.

45. The method according to claim 39 wherein the substrate comprises a semiconductor, an insulating material, Si, Ge, Silicon-Germanium alloy, Silicon on Insulator (SOI), MgO, $SrTiO_3$, $MgAl_{2O4}$, or $Al_2O_3$.

46. The method according to claim 39 wherein the over layer comprises an insulation material, a semiconductor material, a layer of Si, Ge or Si-Ge alloy.

47. The method according to claim 39 wherein the substrate and over layer are different materials.

48. The method according to claim 39 wherein the over layer and substrate have different diffusion coefficients whereby diffusion of the material from dopant nanostripe is mainly or totally into the substrate or over-layer having a greater diffusion coefficient.

49. The method according to claim 39 wherein spacer nanostripes are provided prior to applying the fractional layer of dopant material to form the nanostripes.

50. The method according to claim 49 wherein the spacer nanostripes comprise a fractional layer of spacer material of low surface energy.

51. The method according to claim 39 wherein a doped semiconductor material is deposited.

52. The method of preparing an array of conducting or semi-conducting nanowires according to claim 39 wherein pairs of conversely doped dopant nanostripes are formed, and wherein depositing comprises:

i. collimating a first flux of atoms forming the fractional layer of the first dopant material and directing the first flux at a shallow angle with respect to the substrate surface to form dopant nanostripes of the first material in one area of the topographic structure; and ii. collimating a second flux of atoms forming the fractional layer of the second dopant material and directing the second flux at a shallow angle with respect to the substrate surface to form dopant nanostripes of the second material at a different area of the topographic structure.

53. A method of making a back gate field effect transistor device wherein the channel comprises one or more nanowires made in accordance with the method of claim 39 wherein the transistor has a dielectric layer separating the gate from the channel, and wherein the nanowire is prepared by;

choosing a silicon on insulator (SOI) substrate with a heavily doped semiconductor layer underneath the dielectric oxide layer;

forming an array of walls or another topographic structure on the substrate by lithography;

depositing a dopant material by directing a collimated beam of dopant material at a shallow angle with respect to the substrate surface;

depositing an over layer of semiconductor material to form a multilayer structure; and optionally, annealing the multilayer structure wherein diffusion of the dopant material into one or more of the substrate or over layer forms the nanowires and/or forms epitaxial material of the nanowires.

54. The method according to claim 1 in which the materials of the substrate, over layer and dopant nanostripes create strain in the nanowires due to lattice mismatch between the materials of the substrate and one of the doped nanowires.

* * * * *